United States Patent
Wang et al.

(10) Patent No.: US 8,756,710 B2
(45) Date of Patent: Jun. 17, 2014

(54) MINIATURIZED CANTILEVER PROBE FOR SCANNING PROBE MICROSCOPY AND FABRICATION THEREOF

(75) Inventors: Weijie Wang, Thousand Oaks, CA (US); Chanmin Quanmin Su, Ventura, CA (US)

(73) Assignee: Bruker-Nano, Inc., Santa Barbara, CA (US)

( * ) Notice: Subject to any disclaimer, the term of this patent is extended or adjusted under 35 U.S.C. 154(b) by 0 days.

(21) Appl. No.: 13/601,906

(22) Filed: Aug. 31, 2012

(65) Prior Publication Data

US 2014/0068823 A1 Mar. 6, 2014

(51) Int. Cl.
*G01Q 70/16* (2010.01)

(52) U.S. Cl.
USPC ............. 850/60; 850/21; 850/40; 850/52; 850/53; 850/56

(58) Field of Classification Search
USPC .......... 850/21, 29, 32, 40, 45, 48, 52, 53, 56, 850/57, 59, 60
See application file for complete search history.

(56) References Cited

U.S. PATENT DOCUMENTS

| | | | |
|---|---|---|---|
| 5,618,760 A * | 4/1997 | Soh et al. | 438/703 |
| 5,633,209 A * | 5/1997 | Leedy | 216/2 |
| 6,458,206 B1 | 10/2002 | Givargizov et al. | |
| 7,151,256 B2 | 12/2006 | Guillom et al. | |
| 7,182,876 B2 | 2/2007 | Nam | |
| 7,227,176 B2 | 6/2007 | Wu et al. | |
| 7,451,638 B1 | 11/2008 | Sahin et al. | |
| 7,494,593 B1 | 2/2009 | Chen et al. | |
| 7,637,960 B2 | 12/2009 | Cai et al. | |
| 7,691,661 B2 | 4/2010 | Minne | |
| 7,823,216 B2 | 10/2010 | Fan et al. | |
| 7,913,544 B1 * | 3/2011 | Chand | 73/105 |
| 8,011,016 B2 | 8/2011 | Sulzbach et al. | |
| 8,062,535 B2 | 11/2011 | Lee | |
| 2006/0073627 A1 | 4/2006 | Park et al. | |
| 2008/0011066 A1 * | 1/2008 | Suh et al. | 73/105 |
| 2008/0016953 A1 | 1/2008 | Suh et al. | |
| 2010/0188113 A1 | 7/2010 | King | |
| 2012/0090058 A1 | 4/2012 | Lee | |

FOREIGN PATENT DOCUMENTS

| | | |
|---|---|---|
| KR | 1019980065177 | 10/1998 |
| KR | 1020030033237 | 5/2003 |
| KR | 1020090012694 | 2/2009 |

OTHER PUBLICATIONS

International Search Report and Written Opinion for International Application No. PCT/US2013/056809 dated Nov. 27, 2013.

* cited by examiner

*Primary Examiner* — Michael Logie
(74) *Attorney, Agent, or Firm* — Patterson Thuente Pedersen, PA

(57) ABSTRACT

Cantilever probes are formed from a multilayer structure comprising an upper substrate, a lower substrate, an interior layer, a first separation layer, and a second separation layer, wherein the first separation layer is situated between the upper substrate and the interior layer, the second separation layer is situated between the lower substrate and the interior layer, and wherein the first and the second separation layers are differentially etchable with respect to the first and the second substrates, the interior layer. The upper substrate is a first device layer from which a probe tip is formed. The interior layer is a second device layer from which a cantilever arm is formed. The lower substrate is a handle layer from which a handle, or base portion, is formed. Patterning and etching processing of any layer is isolated from the other layers by the separation layers.

18 Claims, 27 Drawing Sheets

(90-deg rotated)

(90-deg rotated)

(Top View)

(Top View)

(Top View)

(Top View)

(Top View)

(Top View)

(90-deg rotated)

(90-deg rotated)

(90-deg rotated)

MINIATURIZED CANTILEVER PROBE FOR SCANNING PROBE MICROSCOPY AND FABRICATION THEREOF

FIELD OF THE INVENTION

The present invention relates generally to scanning probe microscopy and, more particularly, to a miniaturized cantilever probe structure and methods of producing the same.

BACKGROUND OF THE INVENTION

Scanning probe microscopes (SPMs), such as the atomic force microscope (AFM), are instruments which typically use a sharp tip to characterize the surface of a sample down to nanoscale dimensions. The term nanoscale as used for purposes of this invention refers to dimensions smaller than one micrometer. SPMs monitor the interaction between the sample and the probe tip. By providing relative scanning movement between the tip and the sample, surface characteristic data can be acquired over a particular site on the sample, and a corresponding map of the site can be generated. Because of their resolution and versatility, SPMs are important measurement devices in many diverse fields including semiconductor manufacturing, material science, nanotechnology, and biological research.

The probe of a typical SPM includes a very small cantilever fixed to a support (i.e., a handle) at its base and having a sharp probe tip extending from the opposite, free end. The probe tip is brought very near to or into contact with a surface of a sample to be examined, and the deflection of the cantilever in response to the probe tip's interaction with the sample is measured with an extremely sensitive deflection detector such as an optical lever system as described, for example, in Hansma et al. U.S. Pat. No. RE 34,489, or some other deflection detector such as strain gauges, capacitance sensors, etc. The probe is scanned over a surface using a high resolution three-axis scanner acting on the sample support, the probe, or a combination of both. The instrument is thus capable of measuring the topography or other surface properties or nanomechanical properties of the sample. Cantilever probes can be made from conductive material, enabling measurement of electrical properties.

SPMs may be configured to operate in a variety of modes, including modes for measuring, imaging, or otherwise inspecting a surface, and modes for measuring nanomechanical properties of a sample. In a contact mode operation, the microscope typically scans the tip across the surface of the sample while maintaining a constant probe-sample interaction force. In an oscillation mode of operation, sometimes referred to as tapping mode, the tip of the SPM is oscillated while interacting with the sample at or near a resonant frequency of the cantilever of the probe. The amplitude or phase angle of this oscillation is affected by the probe-sample interaction, and changes in the oscillation are sensed.

As the probe is scanned over the surface of the sample, a probe positioning control system monitors the interaction of the probe with the sample surface such as, for example, deflection of the cantilever (in the case of contact mode), or changes in the oscillation amplitude or phase angle (in the case of oscillating mode). The control system adjusts the probe's position (or average position in the case of oscillating mode) relative to the sample to maintain a constant probe-sample interaction. The position adjustment thus tracks the topography of the sample. In this way, the data associated with the position adjustment can be stored, and processed into data that characterizes the sample. This data can be used to construct an image of the inspected sample's surface, or to make certain measurements of selected surface features (such as, for example, a height of the feature).

The probe position adjustment is effected by a cantilever positioning actuator that is driven by a driving circuit. Various technologies for cantilever actuators are known, including piezoelectric and magnetic transducers. The driving circuit generates a probe positioning signal, and amplifies the probe positioning signal to produce a driving signal that is applied to the actuator. The driving signal continuously repositions the probe's separation distance from the sample to track an arbitrary topography of the sample's surface. Accordingly, the driving signal has a bandwidth from zero hertz to a frequency associated with the maximum operating bandwidth of the SPM, which corresponds to the maximum speed at which the probe can track the topography of the surface of the sample.

Some of the more recent developments in SPM technology have focused on high-speed scanning that can provide scanning speeds at a video rate such that the sample can be observed in near real-time. This presents a number of challenges. For one, the cantilever probe should have a high enough resonance frequency to enable scanning over an arbitrary topography at a required video rate. Ideally, the cantilever should be as "fast" as possible so that larger areas can be scanned at the desired rate. Resonance frequencies on the order of 1 MHz or more are desired. At the same time, the cantilever probe should provide maximum sensitivity in terms of deflection amount for a given interaction force with the sample. A more sensitive cantilever probe can be used to minimize the forces exerted on samples during measurement, thereby obtaining better characterization of a sample's true properties.

Unfortunately, there is a trade-off between speed and sensitivity in cantilever probes. A softer, i.e., lower-spring-constant cantilever probe that is more sensitive tends to have a lower resonance characteristic, thereby being less fast. Improvement in both properties can be obtained by scaling down the cantilever probe's dimensions. Accordingly, a cantilever probe that is shorter, narrower, and thinner, is desired.

Scaling down the cantilever probe dimensions presents its own host of problems. The generally preferred fabrication process is a batch process utilizing nanoelectromechanical systems (NEMS) techniques applied on a wafer scale rather than on an individual basis. These techniques include thin film deposition and photolithography operations enabling the mass-production of cantilever probes. As the smallest dimensions of the cantilever probe are reduced to the sub-micron scale, the conventional fabrication processes become exceedingly difficult to control uniformly. This problem lies in the use of chemical etching and controlling the amount of etching of the thin membrane that is to become the cantilever arm.

Individually-fabricated high-performance probes can be made using techniques such as Electron Beam-Induced Deposition (EBID) of the probe tip as a step separate from formation of the cantilever arm. However, these single-device techniques are not amenable to mass production. Probes produced in this manner can cost 1-2 orders of magnitude more than mass-produced probes. Therefore, a solution is needed to enable batch (wafer-scale) production of cantilever probes having similar or better characteristics than individually-produced probes. The batch process means producing multiple devices or AFM probes in parallel on each wafer and processing one or more wafers simultaneously. Typical materials used for cantilever probes include cantilever arms made from silicon or silicon nitride ($Si_xN_y$) film. Probe tips can be made from a variety of materials, though silicon is generally preferably because the tips can be made very sharp using relatively simple etching techniques and a thermal oxidation process in which a layer of silicon dioxide, ($SiO_2$) is grown on the tip structure.

In the fabrication of a traditional cantilever probe made from a silicon cantilever arm with a silicon probe tip, the starting point is usually a blank silicon wafer. Cantilever arms are produced by reducing the blank wafer thickness in a certain patterned area, typically with a density of 300 devices in a 4 inch wafer. Such a wafer usually has variation of the thickness in some areas, typically +/−1 micron for a 300 micron-thick wafer. As the etching proceeds to produce the cantilever arm of 1 micron thickness, for example, etching must remove 299 microns of material a 300-micron wafer. Due to the +/−1 micron uneven thickness of the wafer, the removal of 299 microns of material will produce 1 micron-thick cantilever arms in an area of 300-micron thickness, 2 micron-thick cantilever arms in the area of 301 micron thickness, and no cantilever arm at all in an area of 299-micron thickness. The cantilever arm formation yield from the various processing steps of forming the cantilever arms, defined by cantilever arms with a thickness within a desired range, is only around 30% if the +/−1 um unevenness of the wafer thickness is equally distributed throughout the wafer (in regions having sizes exceeding the size of the cantilever arms). In an industrial-scale production environment, such yield is unacceptable. It has been very difficult to form a thin layer of silicon less than 1000 nm thick to be used as cantilever arms from a larger bulk material without either encountering a low production yield or large variation in cantilever arm thickness from one batch to another even if the etch rate is controlled precisely. In produced batches with relaxed tolerances, the thickness variation produces an exponentially greater variation in spring constant because spring constant is proportional to the third power of cantilever arm thickness.

Making cantilever probes with arms thinner than 1 micron is far more difficult. One approach has been to utilize a chemically dissimilar material, such as a thin film of silicon nitride ($Si_3N_4$) with an even thickness by chemical vapor deposition (CVD) and pattern the deposited material into a cantilever arm. In these conventional cantilever probes made with silicon nitride cantilever arms and silicon tips, the nitride cantilever arm can be made thinner and with a uniform thickness than the cantilever arm of an all-silicon probe because etching of material to form the silicon tip and handle has virtually no effect on the nitride cantilever arm. In this case it is much easier to control cantilever thickness and size. However, such a process creates other challenges, namely, with using silicon to form a sharp tip by anisotropic etching because there is no silicon material above the CVD-applied $Si_3N_4$ to form the tip. Typically, a serial (non-batch) process such as electron beam deposition is used to form a tip on a silicon nitride cantilever arm.

Other approaches have been proposed for batch processing, though with mixed results and limitations in scaling down the dimensions. Moreover, in batch processing to form the silicon tip and to pattern the nitride cantilever arm to its desired width dimensions and shape, conventional processing has often required photolithography operations to be performed on structures supported by only the thin nitride membrane. This results in breakage of around 10% of the cantilever arms of a typical batch, with another 10% being lost to other causes. Even with this reduced yield, the thinnest practical cantilever arm that can be made economically using the conventional process is around 200 nm.

More recent advances have introduced a buried layer technology in which, prior to cantilever probe formation, multilayer structures are formed at the wafer level. In one type of structure called silicon-on-insulator (SOI), used in the process disclosed in Qingkai Yu, Guoting Qin, Chinmay Darne, Chengzhi Cai, Wanda Wosik, and Shin-Shem Pei, Fabrication of Short and Thin Silicon Cantilevers for AFM with SOI Wafers, 126 Sensors and Actuators A: Physical, Issue 2 (2006) pp. 369-374, a layer of oxide is grown on top of a first silicon wafer; then, a second silicon wafer is bonded to the top of the oxide to form a single silicon-oxide-silicon wafer or slab, from which multiple cantilevers can be formed by batch processing. The buried oxide layer separates the device layer on which the silicon cantilever arm and probe tip are formed, from the handle layer in which a large portion of silicon at the base of the cantilever is kept. This allows the handle layer to be etched using a chemical that attacks silicon but not silicon dioxide, to release the cantilever without also etching into the device layer. However, the device layer must still be etched using a time-controlled process to control the cantilever arm thickness. Reduced etchant concentrations may be used to slow down the material removal process for greater control, but doing so reduces the processing throughput and increases the expense of cantilever probe fabrication.

In U.S. Pat. No. 7,913,544, a fabrication process is proposed in which a buried oxide layer is used in the fabrication of a cantilever probe with a nitride film cantilever arm and a silicon tip. In this approach, the probe tip is formed with a base pad. Thereafter, the nitride film is deposited so that part of it binds to the silicon tip's base pad. The resulting cantilever structure has the base pad and cantilever tip at the free end of the cantilever arm. This approach can address the problem of having to pattern the thin film nitride cantilever arm after it has been released from the backside; however the base pad thickness is difficult to control for the reasons discussed above. The size and performance of the cantilever are also limited in this process due to challenges with aligning the base pad and nitride cantilever arm, and having a cantilever structure in which the effective cantilever arm is composed of both, nitride film, and the part of the base pad leading up to the probe tip.

In U.S. Pat. No. 7,182,876, a buried nitride-oxide multilayer structure is proposed as the starting point for batch cantilever probe fabrication, with the nitride layer intended to be formed into the cantilever arm in later processing steps. The use of a buried nitride layer allows formation of the probe tip directly over the cantilever arm; however, this approach requires protecting the probe tip when the handle layer, made from the same material, is etched. Typical protocol for protecting the probe tip involves depositing a protective coating of nitride film over the tip, which resists the chemical etching of the handle layer. However, the protective layer must then be removed, and this removal etch will also etch the nitride film used for the cantilever arm. Therefore, the same problem of controlling the thickness of the cantilever must be solved with this approach as well.

In general the SPM probe performance is gauged by the operating bandwidth, which is proportional to the resonance frequency f of the cantilever, and level of force control which is inversely proportional to the cantilever spring constant k. Maximizing f/k, or commonly expressed as $f^2/k$, is regarded as optimizing of the probe performance. According to Sader et al., Calibration of Rectangular Atomic Force Microscope Cantilevers, Rev. Sci. Instrum. 70, 3967 (1999), incorporated by reference herein, $f^2/k \sim 1/bhL$, where L is the length, b is the width and h is the thickness. Consequently reducing all the dimensions of the cantilever arm in proportion provides much improved performance. In the extreme case, as shown by Ando et al., A High-Speed Atomic Force Microscope for Studying Biological Macromolecules, PNAS 98, 12468

(2001) the cantilever size is reduced to 2 um×8 um×0.1 um for width, length and thickness respectively. However, scaling down the probe size presents major challenge to batch processing for the many reasons discussed above. In addition to the difficulty of forming a tip on a small cantilever of the size reported in Ando et al., placement of the tip at the small cantilever's free end is also very difficult because of the lithographic error. The SPM field has thus relied on expensive and serial processes to produce such small probes.

An additional demand in SPM applications is that the probes of a given model type are substantially uniform from one to the next, meaning the spring constant variation is preferably smaller than 30%, resonance frequency variation is smaller than 30%, and tip position and geometric variation (tip height and apex radius variation) is less than 40%. It has been impractical to produce such probes in commercial quantities.

In view of the above, a solution to the numerous challenges of miniaturizing silicon tip cantilevers made with either silicon or nitride cantilever arms, is needed.

SUMMARY OF THE INVENTION

Aspects of the invention provide a method that can produce small cantilever probes using a batch process with autonomous control such that the cantilever probes have high performance in terms of resonant frequency and spring constant, and such that batch-manufactured probes have better uniformity than what has been previously possible in the art. One aspect of the invention is directed to a method for constructing a multilayer structure to be used for scanning probe microscope (SPM) cantilever fabrication. According to the method, a first substrate and a second substrate are provided along with a first separation layer and a second separation layer. The first separation layer and the first substrate are differentially etchable and the second separation layer and the second substrate are differentially etchable. An interior layer is provided to be situated between the first separation layer and the second separation layer. The interior layer is differentially etchable with respect to the first and the second separation layers. The multilayer structure is assembled, including situating the interior layer between the first separation layer and the second separation layer such that the interior layer is separated from the first substrate and the second substrate, respectively, by the first separation layer and the second separation layer.

In a related aspect of the invention, after assembling the multilayer structure, material from the first substrate and the first separation layer is selectively removed to expose a first surface of the interior layer while maintaining bonding of a second surface of the interior layer that opposite the first surface, with another layer. Thereafter, portions of the interior layer are removed to form a cantilever arm therefrom. thereafter, material from the second substrate and the second separation layer is selectively removed to expose the second surface of the interior layer, thereby releasing the cantilever arm. A process such as this one is capable of batch-producing cantilever probes having a spring constant of between 0.1 and 1 N/m and a combined cantilever arm and tip with a resonance frequency of between 100 kHz and 10 MHz.

A cantilever probe for use with a scanning probe microscope (SPM) according to another aspect of the invention includes: a base portion formed from a bulk semiconductor material; a cantilever arm having a proximal end situated over the base portion and a distal end protruding beyond the periphery of the base portion; a lower separation layer situated between the base portion and the proximal end of the cantilever arm, the lower separation layer being differentially etchable relative to the cantilever arm and the base portion; a probe tip situated over a portion of the distal end of the cantilever arm; and an upper separation layer situated between the probe tip and the cantilever arm, the upper separation layer being differentially etchable relative to the cantilever arm.

Another aspect of the invention is directed to a mass-produced batch of cantilever probes for use with a scanning probe microscope. The batch includes a plurality of cantilever probes. Each probe includes a base portion formed from a bulk semiconductor material; a cantilever arm having a proximal end situated over the base portion and a distal end protruding beyond the periphery of the base portion and a thickness of between 30 and 300 nm; and a silicon probe tip situated over a portion of the distal end of the cantilever arm. The unsorted variability of the cantilever arm thickness within the batch of cantilever probes is between +/−5% and wherein the production yield within the batch of cantilever probes (defined as the ratio of non-broken cantilever arms) is greater than 90%.

In another aspect of the invention, a process of simultaneously fabricating a batch of cantilever probes, with each probe comprising a handle portion, a cantilever arm, and a probe tip, includes the following operations:

obtaining a multi-layer composite wafer that includes a first layer, a second layer, and a third layer, wherein the first layer includes material for the handle portion of every cantilever probe of the batch, the second layer includes material for the cantilever arm of every cantilever probe of the batch, and the third layer includes material for the probe tip of every cantilever probe of the batch;

removing excess material from the third layer with a first set of etch operations to simultaneously form a plurality of cantilever tips of the plurality of cantilever probes;

removing excess material from the second layer with a second set of etch operations to simultaneously form a plurality of cantilever arms of the plurality of cantilever probes; and removing excess material from the first layer with a third set of etch operations to simultaneously form a plurality of handle portions of the plurality of cantilever probes;

wherein removal of the excess material from each of the first, second, and third layers results in formation of individual cantilever probes having dimensions between 5 and 30 microns in length, between 2 and 15 microns in width, and between 30 and 300 nanometers in thickness, and wherein the thickness of the cantilever arms is not dependent on a duration of the first, second, and third etch operations.

In yet another aspect of the invention, a cantilever probe includes a handle portion, a cantilever arm, and a probe tip. The cantilever probe is produced by process of simultaneously fabricating a batch of cantilever probes, as stated above.

A cantilever probe according to still another aspect of the invention is produced by process of simultaneously fabricating a batch of cantilever probes, the process comprising:

obtaining a multi-layer composite structure that includes a first layer, a second layer, and a third layer, wherein the first layer includes material for the probe tip structure of every cantilever probe of the batch, the second layer includes material for the cantilever arm of every cantilever probe of the batch, and the third layer includes material for the handle portion of every cantilever probe of the batch;

for each cantilever probe of the batch:
performing a high-aspect-ratio anisotropic etch to remove a portion of the first layer and expose an orthogonal surface of the first layer that is oriented orthogonally to the layers of the multilayer structure;
forming an orthogonal protective layer over the exposed orthogonal surface;
selectively removing additional material from the first layer with an isotropic etch to form a probe tip structure having a sharp point facing away from the second layer, wherein the orthogonal protective layer preserves the orthogonal surface during the isotropic etch; and
thereafter, removing the orthogonal protective layer to expose the orthogonal surface of the first layer, wherein the orthogonal surface includes an apex of the probe tip structure.

Another aspect of the invention is directed to a wafer having a batch of partially-formed cantilever probes fabricated simultaneously thereupon for use with a SPM. The wafer includes a plurality of cantilever probes to be released from the wafer in a subsequent operation, each one of which has a base portion formed from a bulk semiconductor material, a cantilever arm having a proximal end situated over the base portion and a distal end protruding beyond the periphery of the base portion, and a thickness of between 30 and 300 nm, and a silicon probe tip situated over a portion of the distal end of the cantilever arm. The cantilever arm has a spring constant of between 0.1 and 1 N/m and a combined cantilever arm and tip with a resonance frequency of between 100 kHz and 10 MHz.

A further aspect of the invention is directed to an improved cantilever probe comprising a handle portion, a cantilever arm having a proximal end and a distal end, with the proximal end situated over the handle portion and the distal end protruding beyond a periphery of the handle portion, and a probe tip structure situated near the distal end of the cantilever arm. In one type of embodiment, the improvement includes the cantilever arm having a length dimension between the proximal and the distal ends, a width dimension, and a thickness dimension, wherein in a reference plane defined by the length dimension and the width dimension, the cantilever arm has a paddle profile that includes a face portion at the distal end and a neck portion between the face portion and the base portion, the neck portion having a smaller width dimension than the face portion.

In another type of embodiment, the improvement includes the cantilever arm having a length dimension between the proximal and the distal ends, a width dimension, and a thickness dimension, wherein in a reference plane defined by the length dimension and the width dimension, the cantilever arm includes a neck portion and a shoulder portion, wherein the shoulder portion is situated at the proximal end of the cantilever arm and protrudes in the distal direction beyond a periphery of the base portion, and wherein the neck portion has a substantially smaller width dimension than the shoulder portion.

BRIEF DESCRIPTION OF THE DRAWINGS

The invention may be more completely understood in consideration of the following detailed description of various embodiments of the invention in connection with the accompanying drawings, in which:

FIGS. 8E'-8H' illustrate a variation of the processing of FIGS. 8D-8E to form the multilayer structure of FIG. 6B according to one embodiment.

Figure 1:
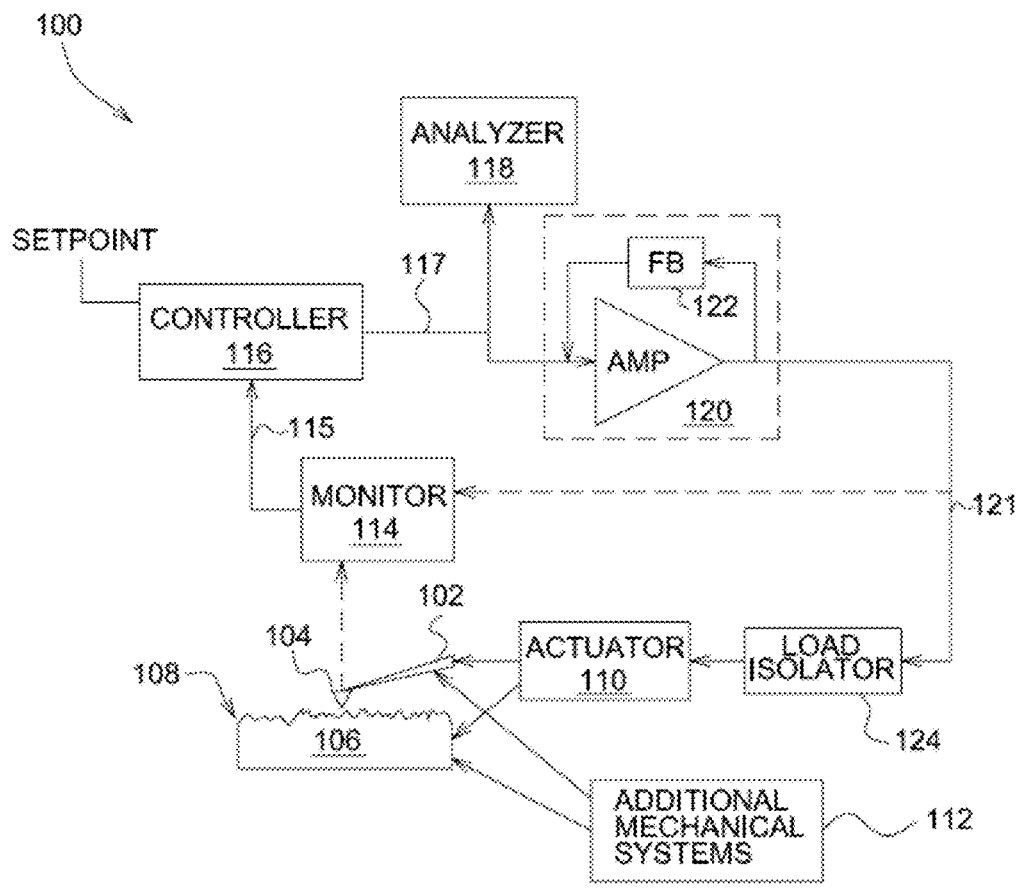
FIG. 1 is a top-level functional diagram illustrating a typical SPM system in which aspects of the present invention are incorporated.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE PREFERRED EMBODIMENTS

FIG. 1 is a top-level diagram illustrating a portion of a typical SPM system 100. System 100 includes cantilever 102 that holds probe 104. Probe 104 is used to inspect sample 106 having surface 108. Surface 108 has a certain topography, which is the subject of the inspection in certain applications. More generally, for samples that do not have major surfaces defined by corresponding aspect ratios, the topography of the sample can similarly be inspected by the SPM. The term topography is defined herein as a representation of a three-dimensional profile of a sample or of a portion of a sample, including, but not limited to, surface features of a sample.

The inspection is accomplished by situating probe 104 relatively to surface 108 by moving either cantilever 102, sample 106, or both, in order to establish a detectable interaction between surface 108 and probe 104. Probe 104 is scanned over or across the sample while probe 104 tracks the topography of sample 106, such as, for example, the topography of surface 108. Tracking of the topography includes, without limitation, following features present on the sample, such as, for example, lines, troughs, walls, corners, cavities, protrusions, and the like.

Figure 2A:
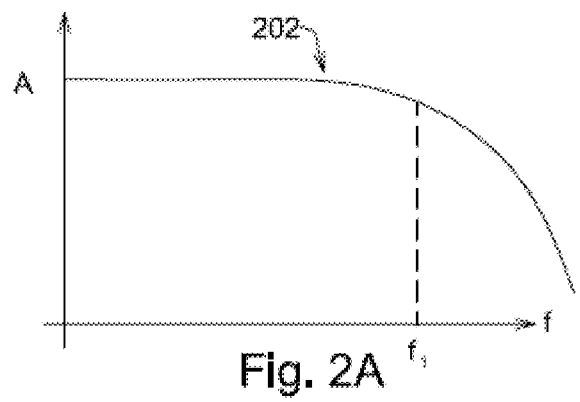
FIGS. 2A-2C generally illustrates amplitude spectra corresponding to actuator motions for topography tracking, oscillation mode, and coarse probe positioning, respectively.

In one embodiment, as illustrated in FIG. 1, SPM system 100 includes an actuator subsystem in which actuator 110 adjusts the probe-sample interaction by moving cantilever 102 relative to surface 108 to produce motion 202 as depicted in FIG. 2A. FIG. 2A illustrates the amplitude spectrum of motion 202, in which motion 202 has an amplitude A and a bandwidth based on rolloff frequency $f_1$. In related embodiments, actuator 110 may move sample 106 relative to cantilever 102, or actuator 110 may move both sample 106 and cantilever 102. The relative motion of cantilever 102 and sample 106 can be perpendicular or oblique to surface 108, and can include translational or rotational motion components. For the sake of simplicity, the relative repositioning of sample 106 and cantilever 102, which adjusts the level of probe-sample interaction shall be termed herein as motion in the z direction, or along the z axis.

Persons skilled in the relevant arts will appreciate that SPM system 100 can be constructed such that the mechanical structure, including the couplings between probe 104 and sample 106, reduce or avoid damping, resonating, or otherwise interacting with the relative motion between the probe and the sample. For instance, actuator 110 may be rigidly mounted to a chassis to which sample 106 is also rigidly mounted.

Additional mechanical systems 112 may also be provided that would include actuators to move cantilever 102 or sample 106, or both, such that the relative motion of probe 104 and surface 108 is along the plane that is generally parallel to surface 108. For simplicity, this motion shall be termed motion in the x-y directions or along the x- or y-axes. This motion in the x-y directions facilitates the scanning of probe 104 over surface 108. As probe 104 is scanned over sample 108, actuator 110 adjusts the relative positioning of cantilever 102 and surface 108 to produce motion 202 to maintain a generally constant level of probe-sample interaction, which results in probe 104 tracking the topography of surface 108. In oscillating mode systems, the probe-sample interaction can be averaged over the oscillation cycle to produce a corresponding scalar representing the level of probe-sample interaction to be maintained as probe 104 is scanned over surface 108.

Figure 2B:
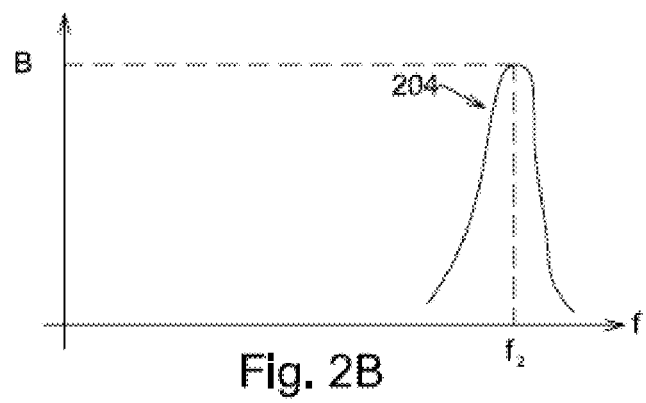

Additional mechanical systems 112 can facilitate the oscillatory motion of cantilever 102 for those embodiments that operate in oscillating mode. FIG. 2B illustrates the amplitude spectrum of oscillating motion 204 in accordance with oscillating mode. Oscillating motion 204 has an amplitude B that is substantially smaller than amplitude A. Although the oscillating motion 204 is typically in the z-direction and affects the probe-sample interaction at different points along the oscillation cycles, the oscillating motion is not generally used to track the topography of surface 108. Oscillating motion 204 has narrow bandwidth centered at a frequency $f_2$ at or near the resonant frequency of the cantilever/probe mechanism, which can be much higher than frequency $f_1$. This relatively narrow bandwidth prevents motion 204 from moving probe 104 to track the arbitrary topography of surface 108. The bandwidth of the z-axis motion includes zero hertz (i.e. DC). Amplitude A of topography-tracking motion 202 has a significantly greater displacement than the amplitude B of the oscillation motion 204. In one embodiment, for instance, topography-tracking motion 202 has a displacement of at least 1 micron. In another embodiment, motion 202 has a displacement of at least 10 microns.

Figure 2C:
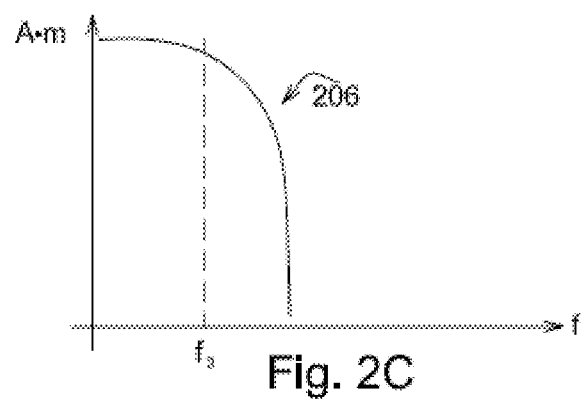

Further, additional mechanical systems 112 can include a coarse adjustment along the z axis for fast engagement and disengagement of probe 104 and surface 108. FIG. 2C illustrates the amplitude spectrum of coarse adjustment motion 206. Coarse adjustment motion 206 has a an amplitude C, which provides a significantly greater displacement than the displacement corresponding to amplitude A of topography-tracking motion 202. However, coarse motion 206 is typically limited in its resolution along the z-axis and is thus not useful for tracking the topography of surface 108 at high speed. In certain situations, such as where the topography changes beyond the range of actuator 110, the coarse z-axis adjustment provided by additional mechanical systems 112 may be used to reposition cantilever 102 or sample 106 to operate actuator 110 within its displacement range.

In a related type of embodiment, actuator 110 can be utilized to provide the oscillation mode motion 204 or the coarse z-direction motion 206. As in the embodiment described above, the oscillation motion 204 provided by actuator 110 differs from the topography-tracking motion 202 in that the oscillatory motion 204 is in response to a narrowband driving signal and has a relatively smaller displacement. The coarse z-axis motion 206 provided by actuator 110 is distinguished from the topography-tracking motion 202 in that the coarse z-axis motion 206 has a substantially limited bandwidth. Thus, the coarse z-axis motion cannot be used to track the topography of surface 108 at the higher scan rates supported by topography-tracking motion 202.

In one type of embodiment, the actuators for the x, y and z axes are piezoelectric stacks. In related embodiments, the actuators can also employ any number of alternative actuation technologies, including but not limited to, other piezoelectric devices, actuators formed from electrostrictive, magnetorstrictive, electrostatic, inductive, and/or voice coil drive mechanisms and other actuators that generate a motion in response to an input signal.

Figure 3A:
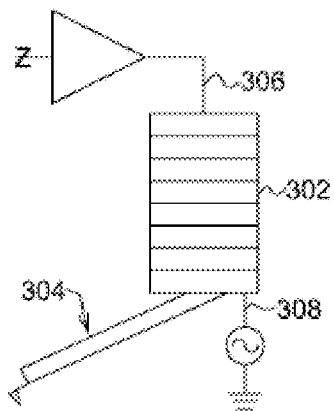
FIGS. 3A-3D are diagrams illustrating various actuator driving configurations for piezo stack actuators.
Figure 3B:
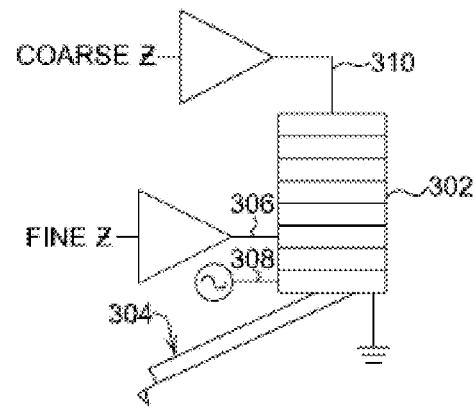
Figure 3C:
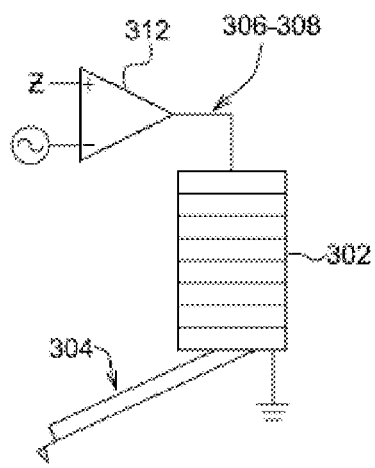
Figure 3D:
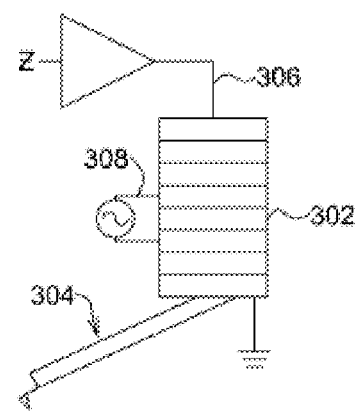

FIGS. 3A-3D illustrate various example configurations for driving a piezoelectric stack-type Z-axis actuator 302 coupled to cantilever 304 with topography-tracking signal 306, oscillation mode signal 308, and coarse z-axis adjustment signal 310 to produce, respectively, motions 202, 204, and 206. In the arrangement of FIG. 3A, topography-tracking signal 306 is applied in series with oscillation mode signal 308 to produce a superposition of these signals. In FIG. 3B, coarse z-axis adjustment signal 310 is applied to the entire piezoelectric stack 302, while topography-tracking signal 306 is applied to a smaller subset of stack 302. Oscillation mode signal 308 is applied to an even smaller portion of stack 302. Application of these signals to corresponding different numbers of piezoelectric elements provides desirable displacement scaling, resolution scaling, and loading scaling characteristics. In the embodiment of FIG. 3C, topography-tracking signal 306 and oscillation mode signal 308 are differentially amplified in driving signal amplifier 312. In the arrangement of FIG. 3D, topography-tracking signal 306 is applied in common mode with piezoelectric stack 302, while oscillation mode signal 308 is applied differentially across a certain portion of stack 302. These example configurations of FIGS. 3A-3D are merely illustrative of the availability of different driving arrangements, and should not be taken as an exhaustive presentation of the extent of possible variants.

Referring again to FIG. 1, SPM system 100 has a control system, including monitor 114 and controller 116 that controls motion 202 to track surface 108. The probe-sample interaction is monitored by monitor 114. In one embodiment, monitor 114 utilizes an optical system in which a laser beam deflection system measures deflection of cantilever 102. In an oscillating mode embodiment, changes in the probe-sample interaction can be detected by observing a change in the oscillation characteristics, such as in a shift in phase offset of the oscillation due to a change in resonance characteristics from the probe-sample interaction.

Monitor 114 produces signal 115 indicating the probe-sample interaction, and feeds signal 115 to controller 116, which compares it against a setpoint signal representing an amount of probe-sample interaction to be maintained. Controller 116 produces probe positioning signal 117, which is input to analyzer 118 as a representation of the topology of surface 108. In the embodiment depicted in FIG. 1, monitor 114 and controller 116 provide a feedback control topology. In other embodiments that are also supported within the scope and spirit of the invention, other types of control topologies are possible. For example, a feed forward control system, or a model-based control system, may be utilized.

Amplifier 120 amplifies probe positioning signal 117 to produce cantilever driving signal 121. In one example embodiment, amplifier 120 is implemented with discrete and integrated electrical/electronic components on a single circuit board. In other embodiments, the circuit of amplifier 120 spans a plurality of interconnected circuit boards, or a plurality of separate interconnected enclosures. Amplifier 120 includes an internal feedback network 122 and load isolating impedance 124.

As described above, SPM manufacturers need solutions for facilitating high-speed measurement while providing good measurement sensitivity. This calls for small and thin cantilever probes that have high resonance frequencies for fast operation, with soft spring constants for increased sensitivity. Accordingly, aspects of the invention are directed to a new type of SPM cantilever probe and related methods of fabrication, as well as to various related features for facilitating high production yields with very tight tolerances.

Figure 4A:
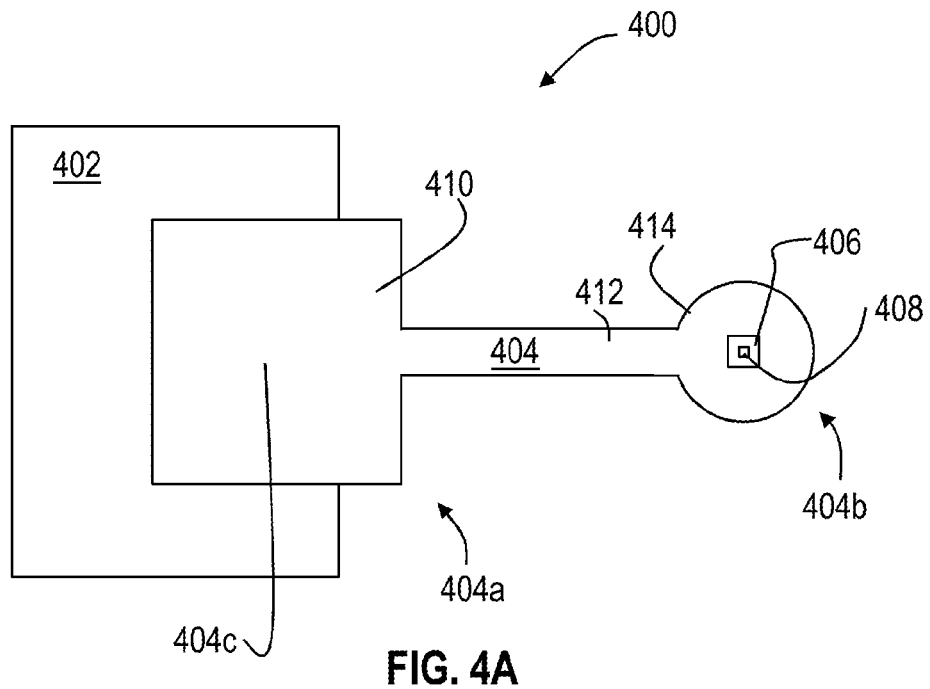
FIG. 4A is a schematic diagram illustrating some of the major parts of an exemplary cantilever probe according to certain aspects of the invention.

FIG. 4A is a schematic diagram illustrating some of the major parts of an exemplary cantilever probe 400 according to aspects of the invention. These parts are not drawn to scale. Cantilever probe 400 is composed of a base portion, or handle, 402. Handle 402 is so named because it is used to handle the cantilever probe. In some embodiments, the other parts of cantilever probe 400 are so small that they are not visible without substantial magnification. Handle 402 is generally made from a relatively large piece of bulk material such as silicon. Cantilever arm 404 has a proximal end 404a and a distal end 404b. Cantilever arm 404 is made from one primary layer of material, generally silicon, or silicon nitride, though other materials can certainly be used. In some embodiments, a metallic coating is applied to one side of cantilever arm 404 to help with optical reflectivity for use with laser beam deflection measurement arrangements, though certain materials may be sufficiently reflective at the optical wavelength of interest to obviate this feature. Structurally, the material from which cantilever arm 404 is formed has a portion 404c that is situated over, and is attached to, handle 402, though this portion does not function as a cantilever per se.

At the distal end 404b is situated the probe tip 406 with apex 408. Probe tip 406 can be formed from silicon in a preferred embodiment, though other suitable materials can be used in other embodiments. In one embodiment, the probe tip 406 is a pyramidal structure. In another embodiment, probe tip 406 has the profile of a right triangle that is aligned with the very end of the cantilever arm 404 such that the apex 408 is situated at the distal end of cantilever arm 404. This latter type of probe tip, called a visible tip, is not actually visible without magnification, and is not visible when the cantilever probe is being used with a SPM; rather, operators are able to infer its position knowing that the apex 408 is aligned length-wise with the end of the cantilever arm 404.

In a related embodiment, cantilever arm 404 includes shoulder 410, which is a wider portion of cantilever arm 404 than narrower neck portion 412. The shoulder 410 is situated at the proximal end over the handle 402. Shoulder 410, by virtue of its much greater width than neck portion 412, has a substantially greater spring constant. In one embodiment, shoulder 410 provides no more than a trivial effect on the overall spring constant of cantilever 400, such that the effective length of cantilever arm 404 is measured from the shoulder-neck interface rather than from the cantilever arm-handle interface as in a conventional cantilever probe.

Figure 4B:
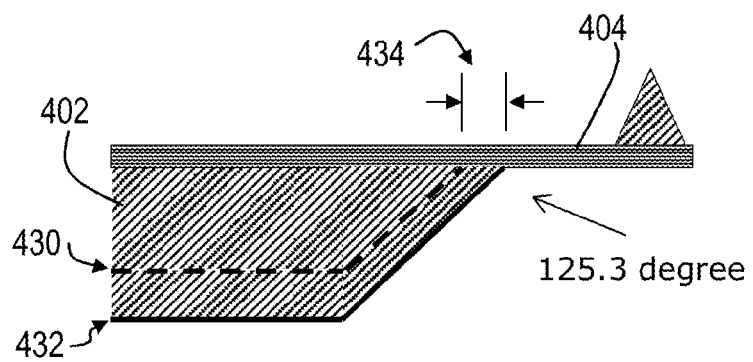
FIG. 4B is a diagram illustrating the beneficial functionality of a shoulder structure according to one type of embodiment.

FIG. 4B is a diagram illustrating the beneficial functionality of shoulder 410. In this diagram, a small, thin cantilever is shown in cross-sectional view without a shoulder. The thickness of handle 402 is affected by the amount of etching performed on it, which is difficult to control precisely. Therefore, some variation in thickness is seen, as indicated by lines 430 and 432. In the case of silicon as the material for handle 402, when cantilever 404 is released, handle 402 forms an angle of 125.3 degrees with cantilever arm 404 due to the material removal following the crystalline structure of silicon. This results in a variation of effective cantilever arm length indicated at 434. In conventional cantilever probes, this length variation is negligible given the relatively larger dimensions. However, in the scaled-down cantilever probe, this length variation can significantly affect the spring constant defined by $$k = \frac{Ewt^3}{4L^3},$$

Where E is Young's modulus, w is the cantilever arm width, t is the cantilever arm thickness, and L is the cantilever arm length.

The use of wide shoulder 410 entirely obviates this problem, provided that the amount of protrusion of shoulder 410 beyond the periphery of handle 402 in the distal direction exceeds the potential length variation 434. In one particular embodiment, the shoulder width is at least 10 times the width of the neck portion 412. In other embodiments, the ratios is of shoulder-to-neck width are 25:1, 50:1, and 100:1 or more.

Referring still to FIG. 4A, in a related embodiment, at the distal end 404b is situated a wider portion in the form of a paddle face 414. Paddle face 414, in various embodiments, can be circular, elliptical, square, triangular, or any suitable shape. Paddle face 414 provides a larger surface area than what is available from the narrow neck portion 404 for providing a laser beam target in the laser beam deflection systems of SPM instruments. In one embodiment, the paddle face 414 has a generally round profile with a diameter in the range of 2-4 microns. It should be noted that paddle face 414 may be entirely omitted for systems which use a sufficiently small laser spot, or for SPM systems that do not use optical means for determining cantilever deflection. In various embodiments, the length of the neck portion 404 of the cantilever arm is longer than a diameter of paddle face 414. In other embodiments, the neck portion 404 is shorter than the diameter of paddle face 414. Among various embodiments, the relative dimensions of the neck portion and paddle face can vary depending on the desired spring constant, desired resonance frequency, material properties, laser spot size, and other parameters. In one example embodiment, the ratio of paddle face diameter to neck portion width is at least 2:1. In a related embodiment, the ratio is between 2:1 and 4:1. In another example embodiment, the ratio of paddle face diameter to cantilever length is between 2:1 and 1:5. These ratios and ranges are exemplary and are not to be construed as limiting unless specifically called out in the claims.

According to various embodiments, cantilever probe 400 has dimensions smaller than 30 microns in effective length (i.e., measured from the shoulder-neck interface), 15 microns in width, and 300 nm thickness. In one particular embodiment the effective length is between 5 and 30 microns, the maximum width is between 2 and 15 microns, and the thickness is between 30 and 300 nm. In a more refined embodiment, the thickness is between 20 and 200 nm. In a further embodiment, the thickness is between 30 and 100 nm. In a further embodiment, the thickness can be made thinner than 30 nm. One particular embodiment provides a length of 8 microns, a maximum width of 2 microns, and a thickness of between 30 and 300 nm. Notably, these dimensions are achieved according to aspects of the invention using wafer-scale, i.e., batch, processing in which patterning and etching techniques are applied to simultaneously produce a plurality of cantilever probes in the batch with size dimensions such as those given above, as well as tight tolerance (e.g., +/−5% thickness variation) at a production yield (defined as non-breakage of cantilevers at the specified length, width and thickness dimensions during processing) of 90% or better. In terms of cantilever performance, according to one embodiment, the spring constant of the cantilever arm is between 0.1 and 1 N/m and the resonance frequency is between 100 kHz and 10 MHz. In a related embodiment, a cantilever probe is produced by a batch process with a spring constant of between 0.1 and 1 N/m with a resonance frequency of between 1 MHz and 10 MHz.

Figure 5:
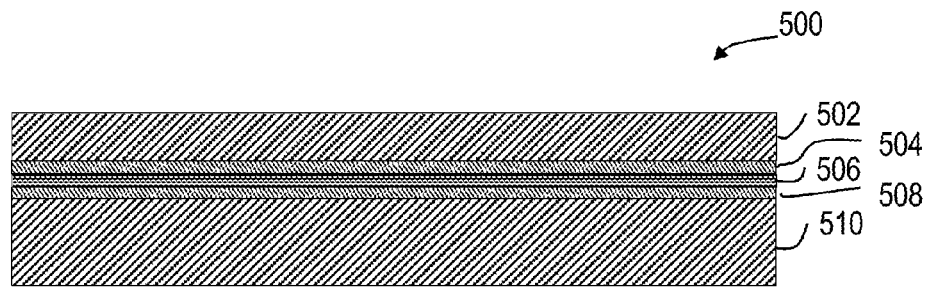
FIGS. 5, 6A, and 6B illustrate exemplary multilayer structures from which cantilever probes can be formed using batch processing to produce a silicon-on-insulator (SOI) probe, a silicon-on-silicon (SOS) probe, and an SOS probe in which the probe tip is electrically connected to the cantilever arm according to various embodiments.
Figure 6A:
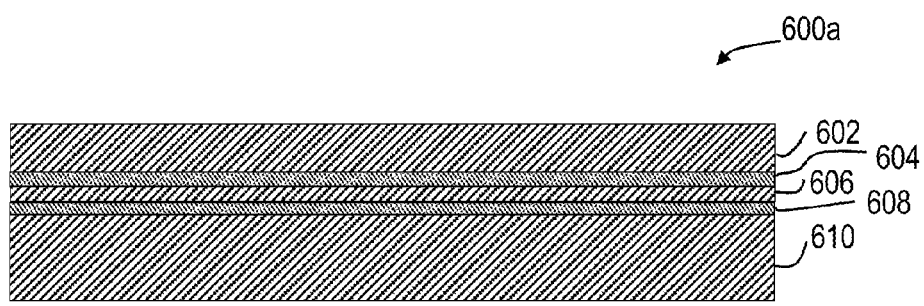
Figure 6B:
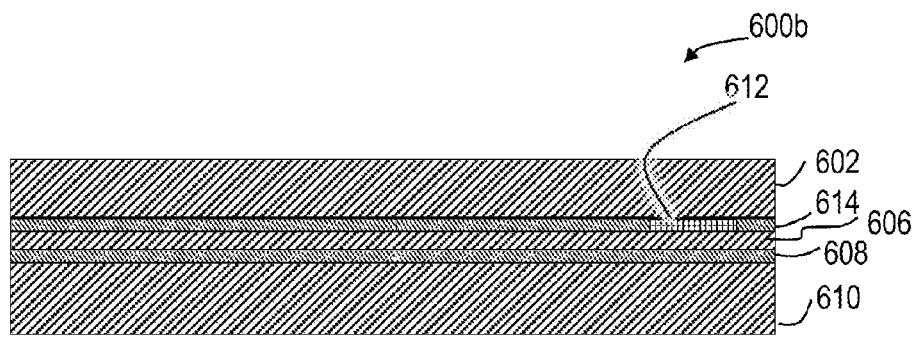

In one aspect of the invention, a multilayered, wafer-scale structure is fabricated initially, using a tight-tolerance process that is, from which a plurality of cantilever probes may be formed using subsequent batch operations. FIGS. 5, 6A, and 6B illustrate exemplary multilayer structures as cross-sectional views (not to scale). These exemplary structures have a common arrangement: a first device layer, a handle layer, and a second device layer situated therebetween, with separation layers between the handle and second device layers, and the first and second device layers. The first device layer is to be formed into a probe tip, whereas the second device layer is to be formed into the cantilever arm. In the embodiments detailed below, the handle and second device layers are silicon, while the first device layer can be silicon or low-pressure chemical vapor-deposited (LPCVD) silicon nitride film, also referred to herein as low-stress nitride, with the separation layers being silicon dioxide, also referred to simply as oxide. It should be appreciated, however, that other suitable materials may be used in conjunction with the layered techniques of embodiments of the invention.

Turning first to FIG. 5, a multilayer structure 500 includes a silicon substrate 502 as the first device layer, followed by a first separation layer 504 made from oxide, a second device layer as the interior layer formed from LPCVD nitride, followed by second separation layer 508, then a second silicon substrate 510 as the handle layer. The separation layers 504 and 508 are differentially etchable with respect to each of the first and second device layers 502 and 504, respectively, and the handle layer 510. The term differentially etchable implies that one layer can be etched at a much higher rate than the other layer such that the slower-etch-rate material can act as an etch stop layer. Typically, differentially etchable materials have an etch rate ratio of at least 50. Depending on the layer material and etchant being employed, the differential etch ratio can be on the order of 100, 1000, or more. In one type of embodiment, the relative thicknesses of adjacent differentially-etchable layers are formed to account for the differential etch rates that the layer from which materials is stripped and the layer to serve as an etch stop to preserve other layers will be exposed to in subsequent processing, such that the material can be stripped fully, while the etch stop layer remains (albeit somewhat reduced due to the etching). Accordingly, with the multilayer structure, the device layers are protected throughout processing such that their thickness is unaffected by the duration of etching operations. This enables very tight control with small tolerances for the layer thicknesses.

In FIGS. 6A and 6B, the interior layer 606, i.e., the second device layer, i.e., the layer to be formed into the cantilever arm, is silicon. Thus, these structures are layered as follows: first device layer 602 (silicon), first separation layer 604 (oxide), second device layer 606 (silicon), second separation layer 608 (oxide), and handle layer 610 (silicon). FIG. 6B includes a pad of conductive material 612, such as polysilicon, to be situated under the probe tip to be formed from the first device layer 602 in subsequent operations. Conductive pad 612 provides an electrical connection through the first separation layer 604 for use with conductive probes (the probes can be made conductive by using highly doped silicon for the first and second device layers).

Figure 7A:
FIGS. 7A-7E illustrate, step-by-step, an exemplary process of formation of the multilayer structure of FIG. 5 according to one embodiment.
Figure 7A:
Figure 7B:
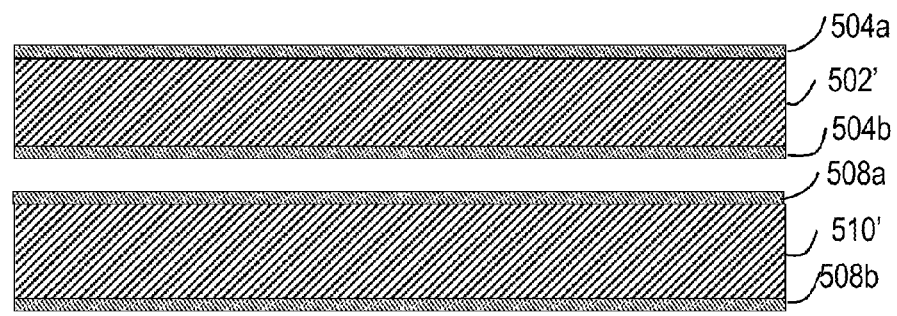
Figure 7C:
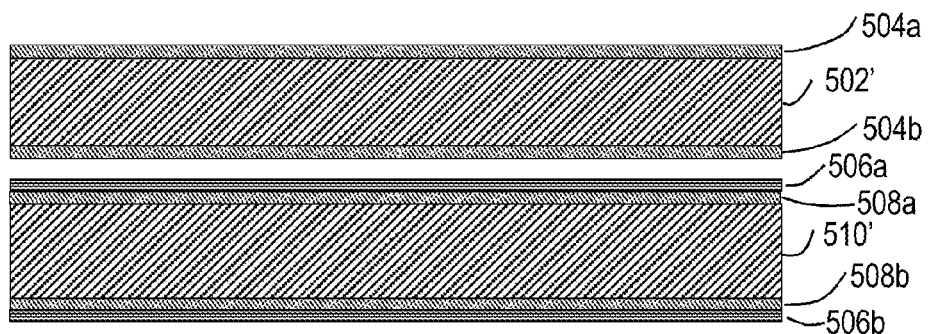
Figure 7D:
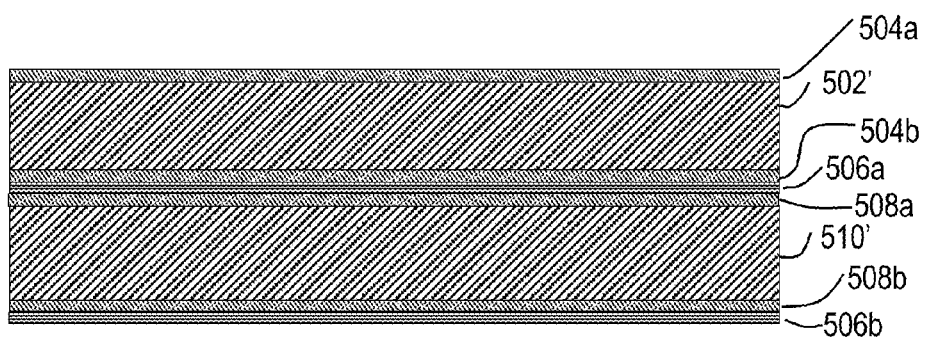
Figure 7E:
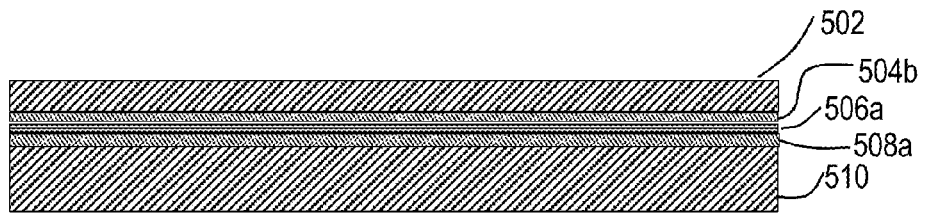

Turning now to FIGS. 7A-7E, an exemplary process of formation of multilayer structure 500 is illustrated. In FIG. 7A two separate substrates, such as silicon wafers, 502' and 510' are prepared. Next, in as illustrated in FIG. 7B, oxide layers 504a, 504b, 508a, and 508b, is thermally grown on the surfaces. Next, as illustrated in FIG. 7C, LPCVD nitride 506a and 506b is deposited over oxide layers 508a and 508b, respectively. Although nitride layer 506b is not needed in this embodiment, there is no need to prevent its deposition because it is removed incidentally with subsequent steps. As depicted, nitride layers 506a and 506b are deposited over the handle layer wafer; though it will be readily appreciated that it could be applied to the first device layer substrate instead, or in addition to the handle substrate. Next, layers 506a and 504b are polished, and bonded, as illustrated in FIG. 7D. Bonding can be achieved with fusion bonding or Anodic bonding (for Silicon to Oxide bonding). Next, as illustrated in FIG. 7E, the first device layer substrate 502' and handle layer substrate 510' are ground and polished to their target thicknesses using a chemical-mechanical polish (CMP) process or other suitable operation. The resulting layers are silicon device layer 502 and silicon handle layer 510.

Figure 8A:
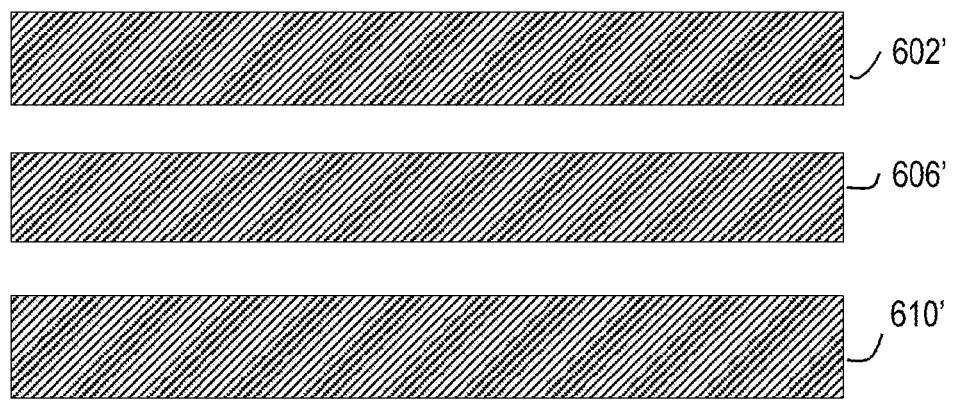
FIGS. 8A-8E illustrate an exemplary process according to various embodiments, for forming the multilayer structure of FIG. 6A.
Figure 8B:
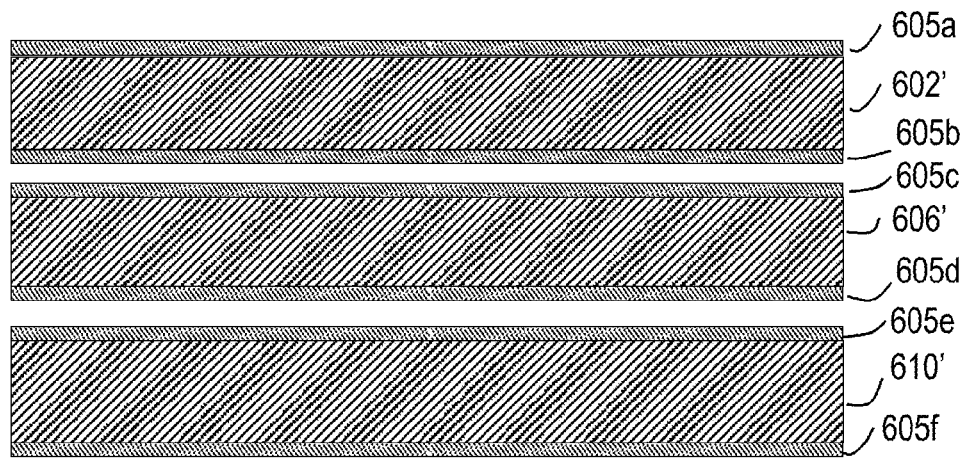

FIGS. 8A-8E illustrate a process of forming multilayer structure 600a according to various embodiments. As depicted in FIG. 8A, three silicon substrates 602', 606', and 610' are used as the starting point. Separation layers 605a-f are then created as depicted in FIG. 8B. In one embodiment, separation layers 605a-e are oxide layers that are thermally grown. In another embodiment, separation layers 605a-e are nitride film that is deposited using a suitable process. In another embodiment, some of separation layers 605a-e can be oxide, while others are nitride.

Figure 8C:
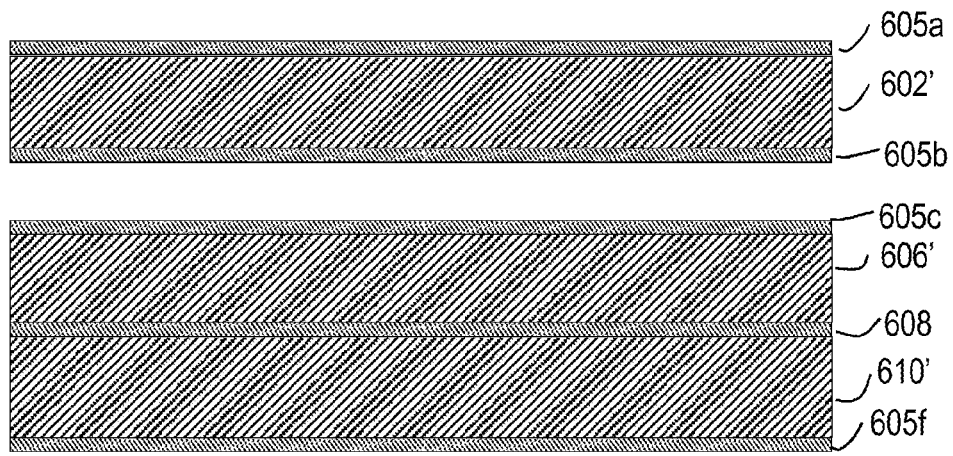
Figure 8D:
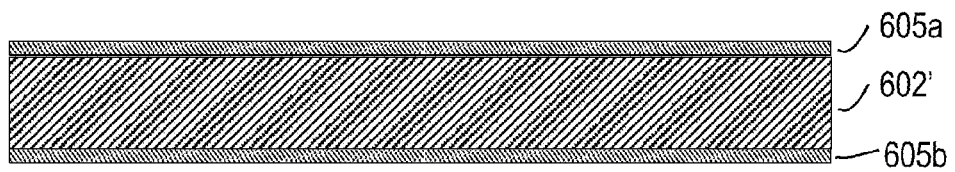
Figure 8D:
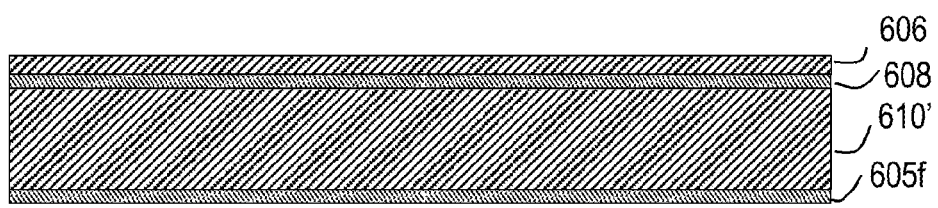
Figure 8E:
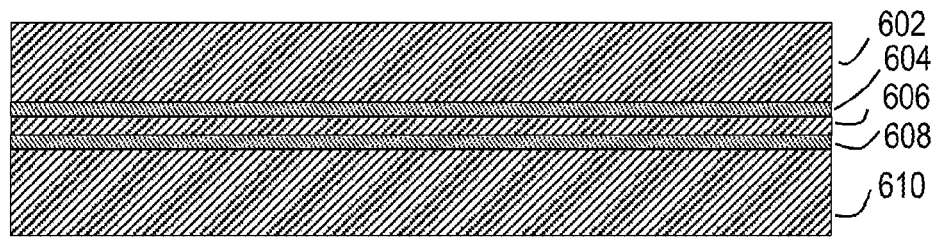
Figure 8E:
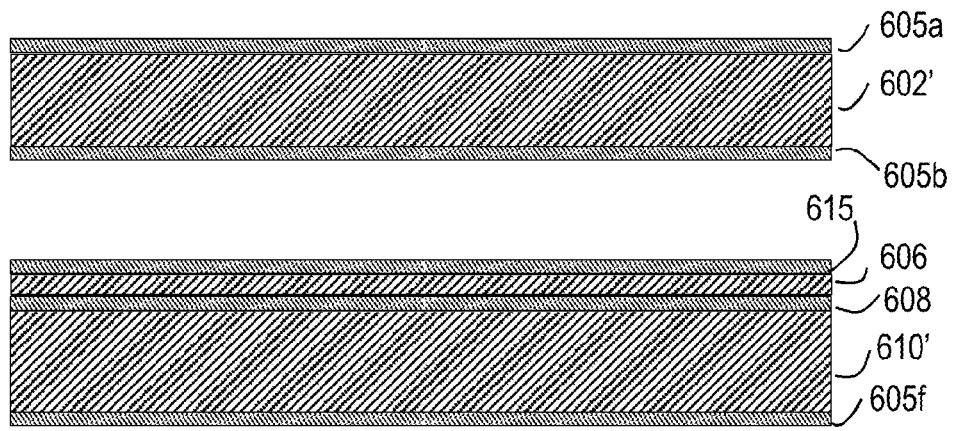
Figure 8F:
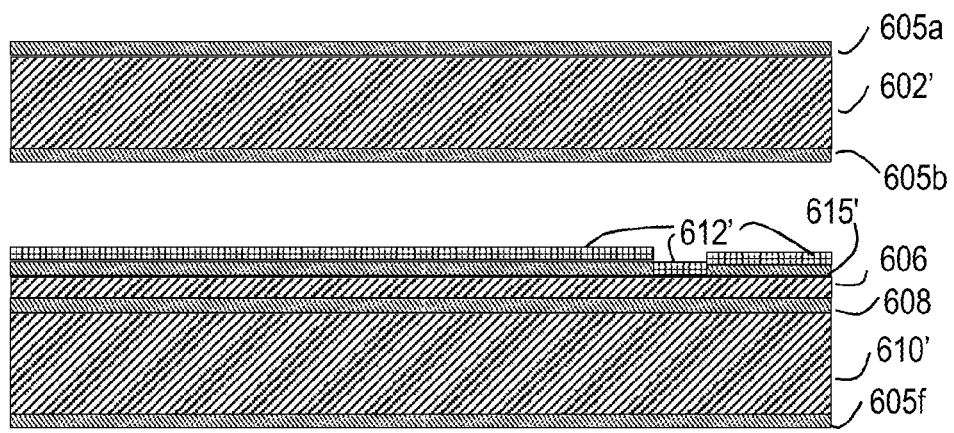

Next, as illustrated in FIG. 8C, coated substrates 606' and 610' are polished at their interface (between layers 605d and 605e) and bonded together using a fusion bonding or anodic bonding process, forming buried separation layer 608. As depicted in FIG. 8D, next, the second device layer 606 is formed by grinding and polishing substrate 606' to the target thickness. This target thickness is carefully controlled using suitable process parameters such that a very thin, e.g., 300-nm or smaller, thickness is attained within the target tolerance. Next, the interface between first device layer substrate 602' (coated with separation layer 605b) and interior (second device) layer 606 is polished, and the layers are fusion or anodically bonded as depicted in FIG. 8E forming buried separation layer 604. The top and bottom surfaces are then ground and polished to their target thickness, removing layers 605a and 605f in the process.

Figure 8G:
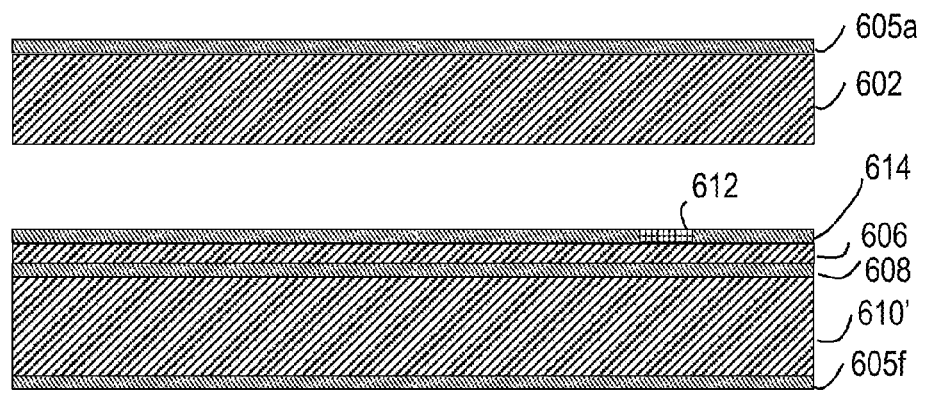

FIGS. 8E'-8H' illustrate a variation of the processing of FIGS. 8D-8E to form multilayer structure 600b. The processing illustrated in FIG. 8E' continues from the state shown in FIG. 8D, in which interior (second device) layer 606 is ground and polished to its target thickness. A new separation layer 615 from either oxide or nitride is grown or deposited, respectively, over layer 606. Next, as illustrated in FIG. 6F', a portion of the new separation layer 615 on the top surface of layer 606 is removed using photolithography and selective etching to create a void in patterned layer 615'. Then, a layer of polysilicon 612' is deposited such that a portion of the polysilicon fills the void in patterned layer 615'. Next, as depicted in FIG. 8G', the polysilicon 612' is patterned to remove all of the polysilicon except for portion 612 filling in the void in layer 615'. Polysilicon portion 612 thus forms a conductive pad.

Figure 8H:

Next, the first device layer substrate 602' is ground and polished to its target thickness, removing layer 605b in the process, and the top surface of layer 615' and conductive pad 612 is polished to create a composite separation layer 614 with integrated pad 612. As depicted in FIG. 8H', and the layers are fusion or anodically bonded, forming buried separation layer 614. Finally, the top and bottom surfaces are ground and polished to achieve the target thicknesses of first device layer 602 and handle layer 610.

Figure 9A:
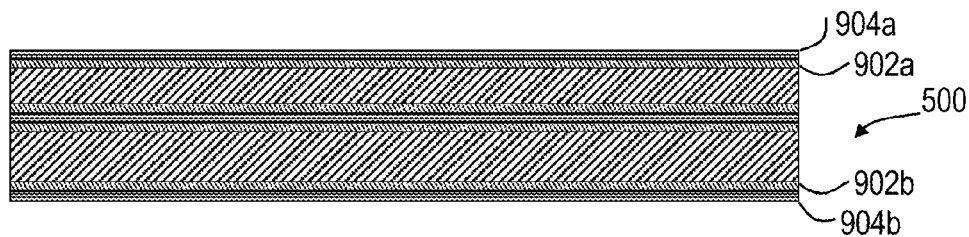
FIGS. 9A-9N illustrate an exemplary process according to one embodiment for batch fabrication of a silicon-on-insulator (SOI) cantilever probe starting with multilayer structure of FIG. 5.
Figure 9B:
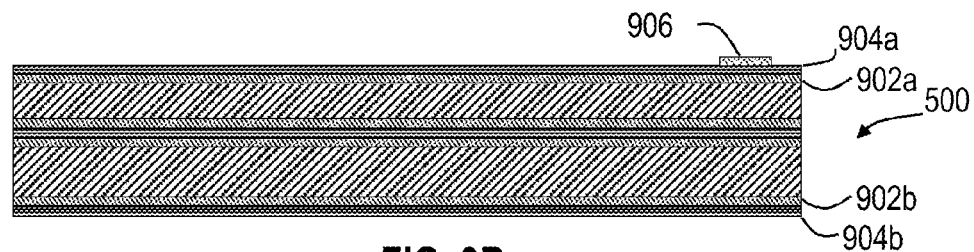
Figure 9C:
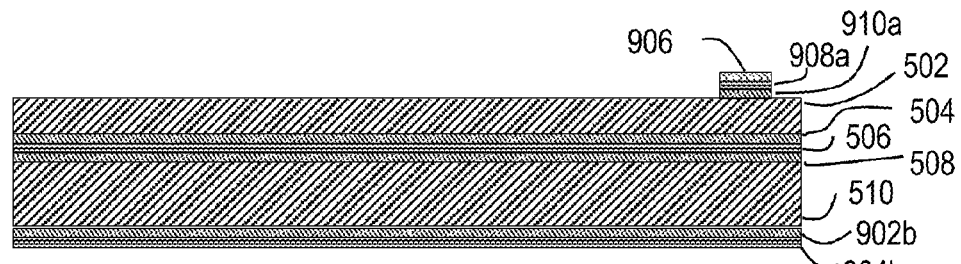
Figure 9D:
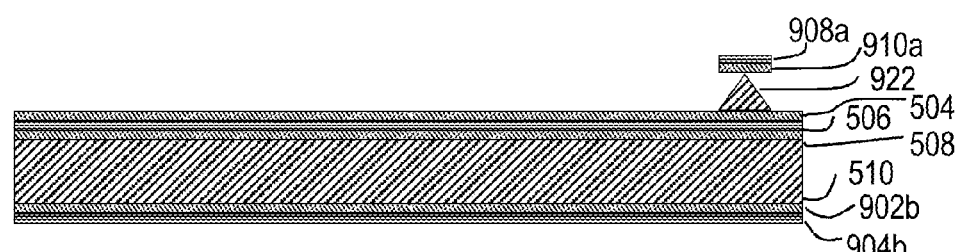
Figure 9E:
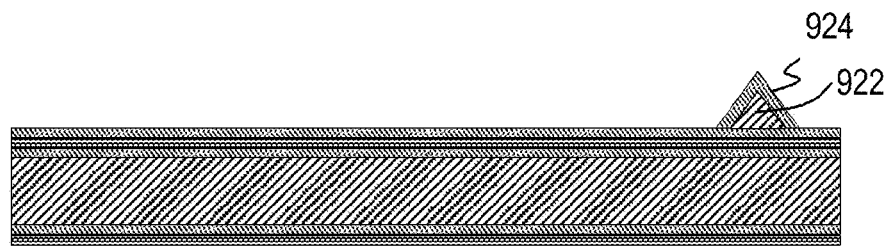
Figure 9F:
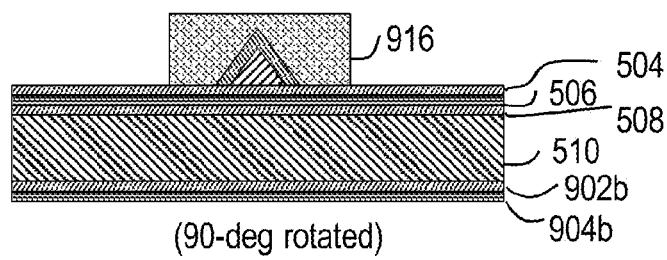
Figure 9G:
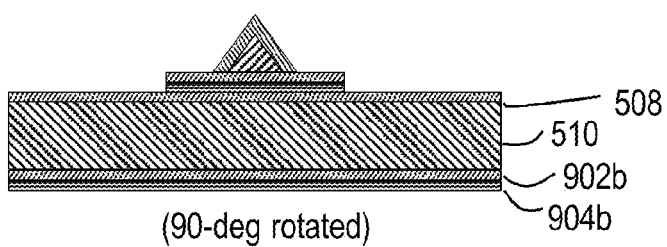
Figure 9H:
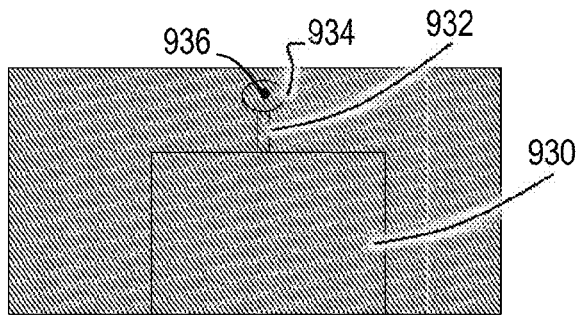
Figure 9I:
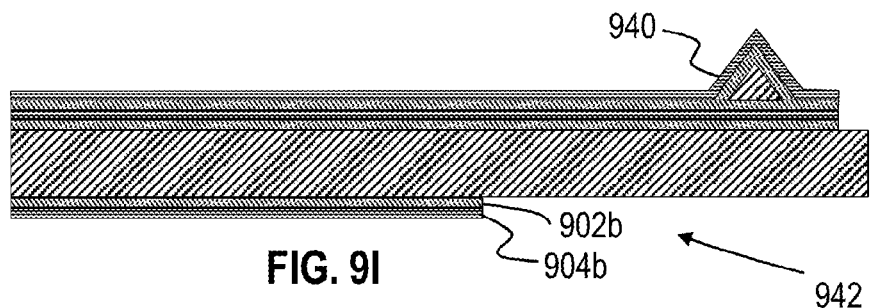
Figure 9J:
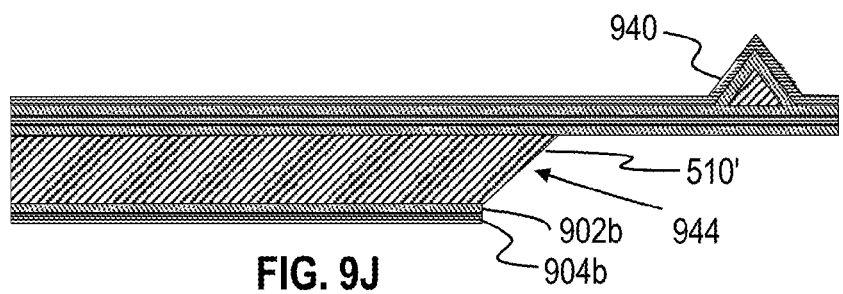
Figure 9K:
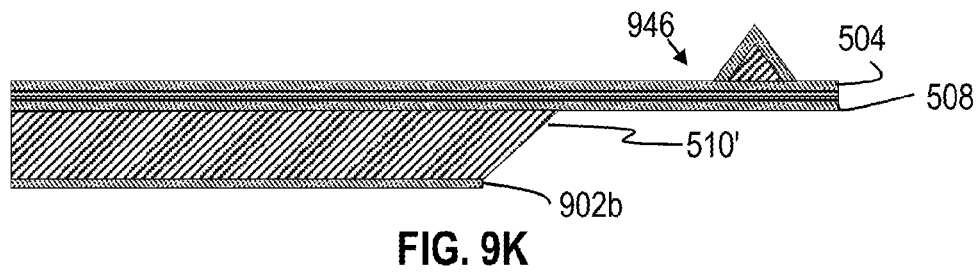
Figure 9L:
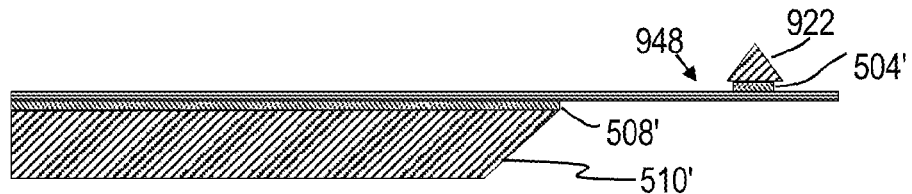
Figure 9M:
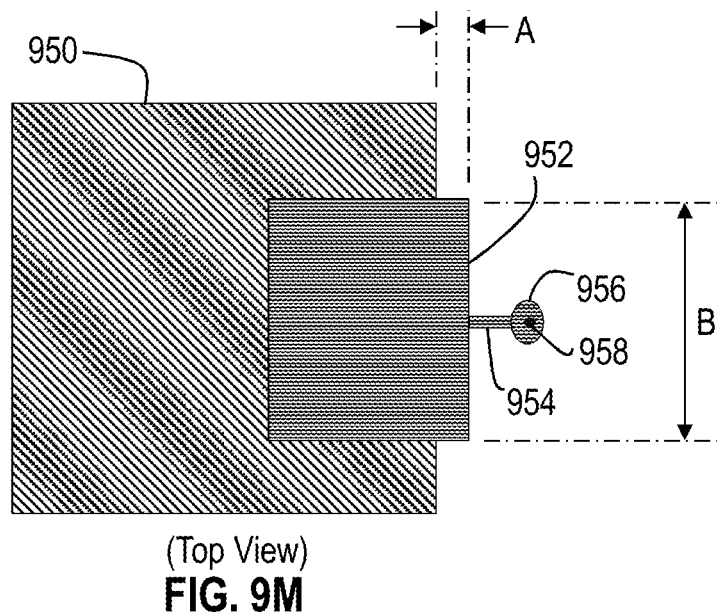
Figure 9N:
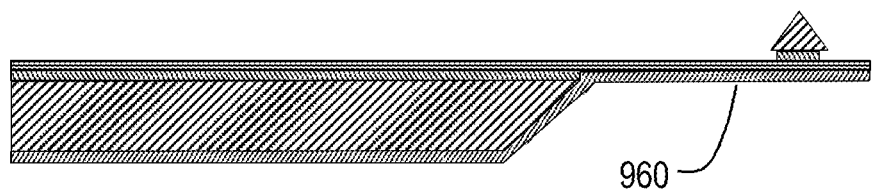

Turning now to processing steps for fabrication of cantilever probes, FIGS. 9A-9N illustrate an exemplary process according to one embodiment for batch fabrication of a silicon-on-insulator (SOI) cantilever probe starting with multilayer structure 500. As depicted in FIG. 9A, oxide layers 902a and 902b are thermally grown over the top and bottom surfaces of multilayer structure 500. Next, nitride is deposited using a CVD process to create nitride layers 904a and 904b. Next, in FIG. 9B, photoresist is applied over the top surface and patterned to create mask 906. Mask 906 is used in subsequent steps in formation of the probe tip.

Next, in FIG. 9C, layers 904a and 902a are selectively etched using a dry etch process to remove all of the nitride and oxide material except for the material masked by the photoresist 906. This leaves structures 908a and 910a. Next, as depicted in FIG. 9D, photoresist 906 is stripped, and silicon layer 502 is anisotropic etched using a chemical that attacks silicon at a much higher rate than oxide, such as potassium hydroxide (KOH) or tetramethylammonium hydroxide (TMAH), for instance. The result is a pointed tip structure 922 formed from the first device layer 502 without affecting the second device layer 506 or the handle layer 510. Thereafter, as depicted in FIG. 9E, oxide 924 is thermally grown over the tip structure, which sharpens the tip.

Next, as depicted in FIGS. 9F and 9G, which are cross-sectional views of the same structure rotated 90 degrees, photoresist mask 916 is applied to protect the tip 922 and parts of layers 504 and 506 during patterning of the cantilever arm. Notably, the cantilever arm is patterned before it is released. In other words, the handle layer 510 still supports the cantilever arm at this stage, making a more robust structure that undergoes the cantilever patterning process. FIG. 9H is a top view diagram illustrating the cantilever pattern, including shoulder portion 930, neck portion 932, paddle face portion 934, and tip 936.

Next, as depicted in FIG. 9I, nitride protective layer 940 is applied over the oxidized tip structure, and a backside lithography process 942 is performed to remove portions of layers 902b and 904b. The remaining material of layers 902b and 904b act as a mask during the subsequent etching 944 of handle layer 510 to release the cantilever arm, as depicted in FIG. 9J. Next, as depicted in FIG. 9K, nitride layers 940 and 904b are selectively etched at 946 using a suitable etchant such as phosphoric acid ($H_3PO_4$), for example. Oxide layers 504 and 508 act as an etch stop to protect interior nitride (second device) layer 506 from this etchant.

As illustrated in FIG. 9L, the exposed oxide layers 504 and 508 are removed at 948 using a suitable etchant that does not attack silicon or nitride at the same rate, such as hydrofluoric acid, for example. The remaining structure includes remaining handle layer 510', the protected and non-removed portion 508' of oxide layer 508, and the un-removed portion 504' of oxide layer 504 beneath the tip 922.

FIG. 9M is a top-view diagram illustrating the resulting structure and patterned cantilever arm. Handle 950 is the large block of silicon. The cantilever arm has a shoulder portion 952 that protrudes in the distal direction beyond the periphery of the handle 950 by an amount A, and has a width B that far exceeds the width of the cantilever neck portion 954. Thus, the effective cantilever arm (as far as its spring constant is concerned) is composed of neck portion 954 and paddle face 956, on which the probe tip 958 is situated. The neck portion 954, being narrow, provides a more sensitive cantilever. Paddle face 956 is useful for providing a target for the laser system in SPM instruments, where needed. Otherwise, the paddle face 956 may be omitted for an even faster cantilever design. Finally, as depicted in FIG. 9N, a metal film 960 is deposited on the bottom side to enhance optical reflectivity where needed.

Figure 10A:
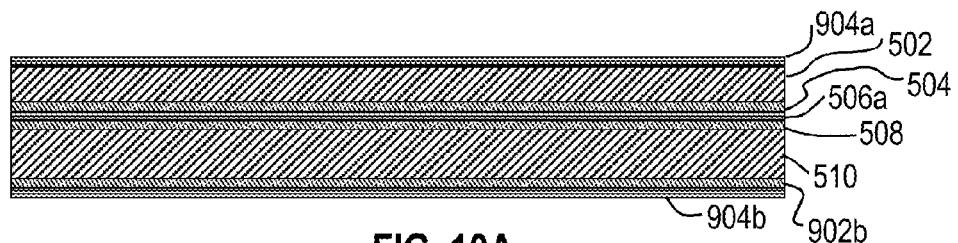
FIGS. 10A-10O illustrate a batch process according to one embodiment for forming a SOI cantilever probe with a self-aligned probe tip that is aligned at the distal end of the cantilever arm.
Figures 1, 10B:
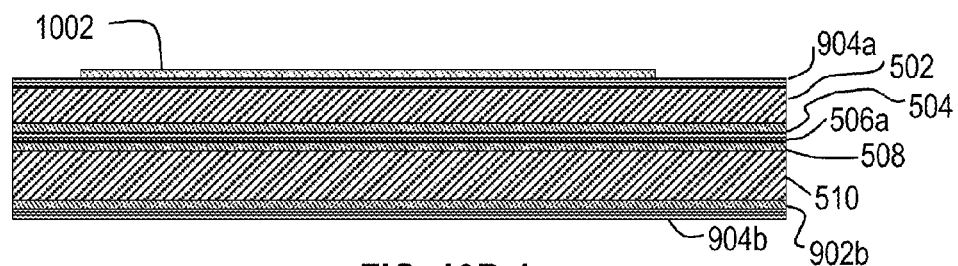
Figures 2, 10B:
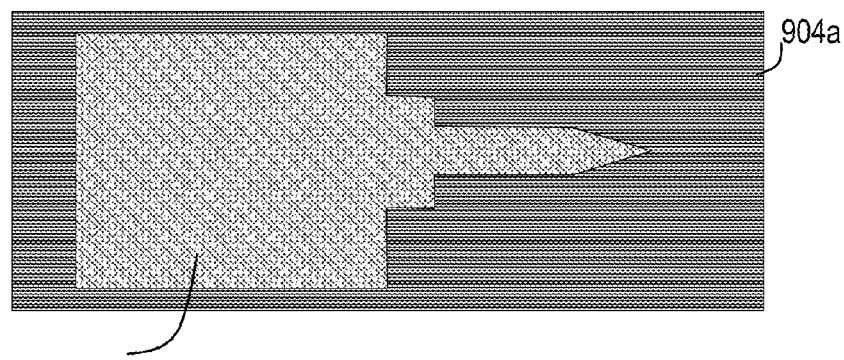
Figures 1, 10C:
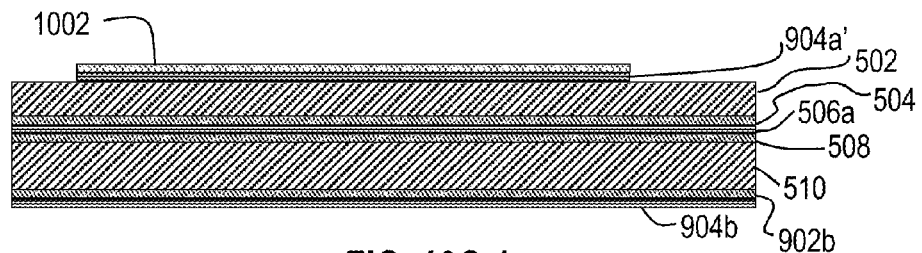
Figures 2, 10C:
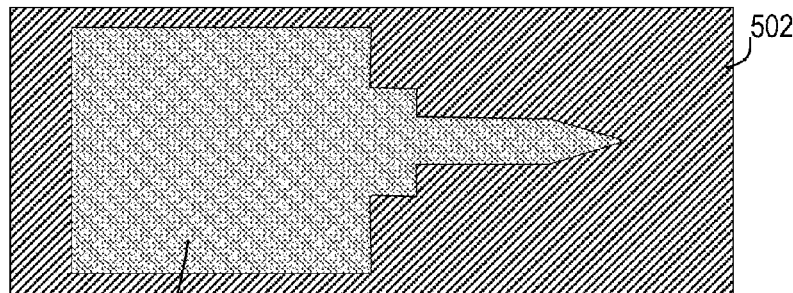
Figures 1, 10D:
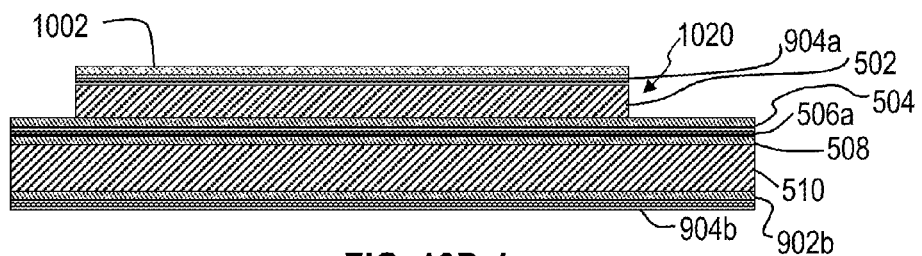
Figures 2, 10D:
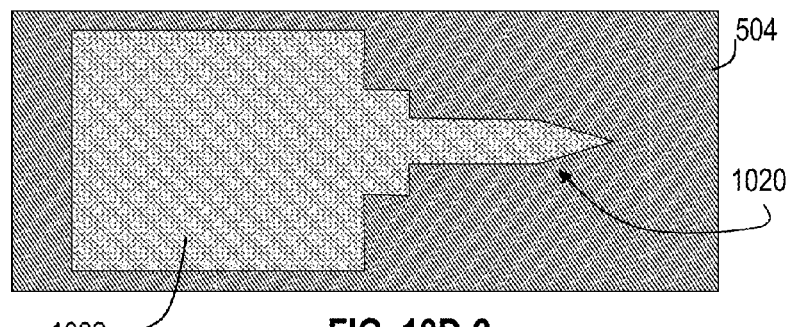
Figure 10E:
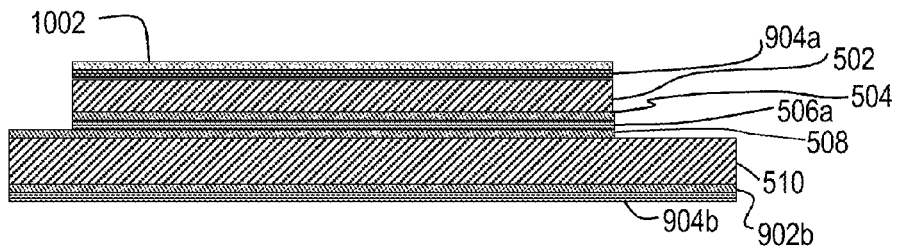
Figure 10F:
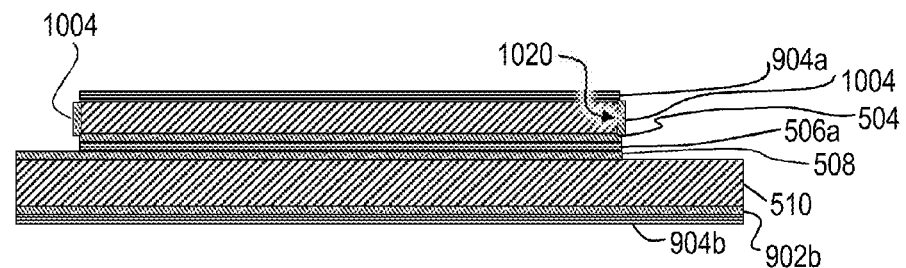
Figures 1, 10G:
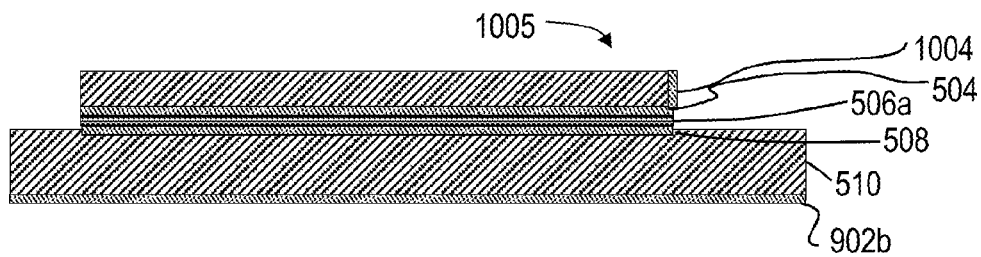
Figures 2, 10G:
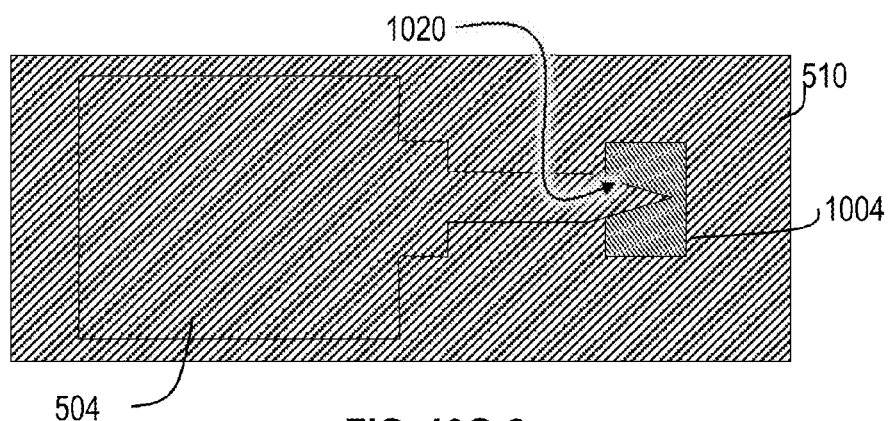
Figure 10H:
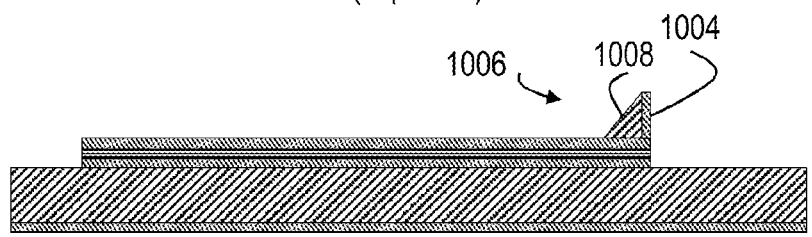
Figure 10I:
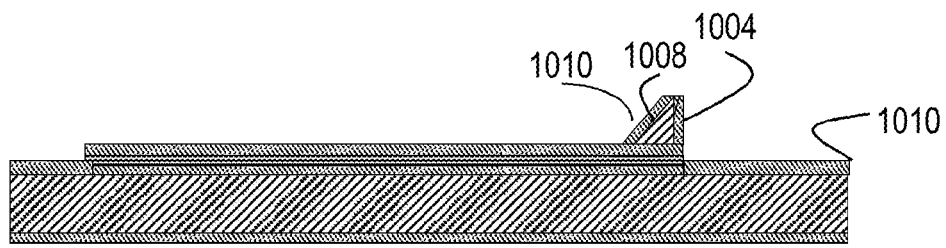
Figure 10J:
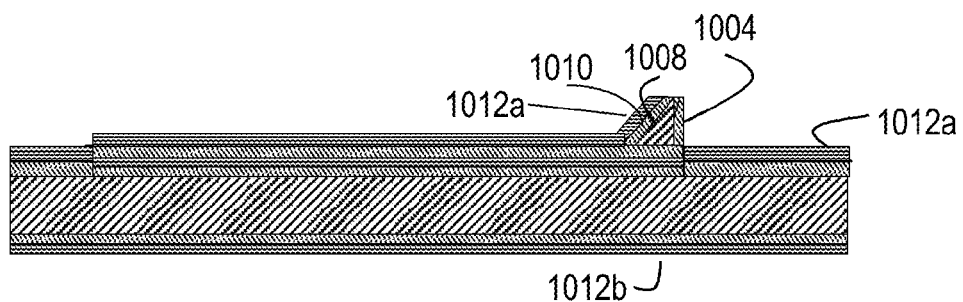
Figure 10K:
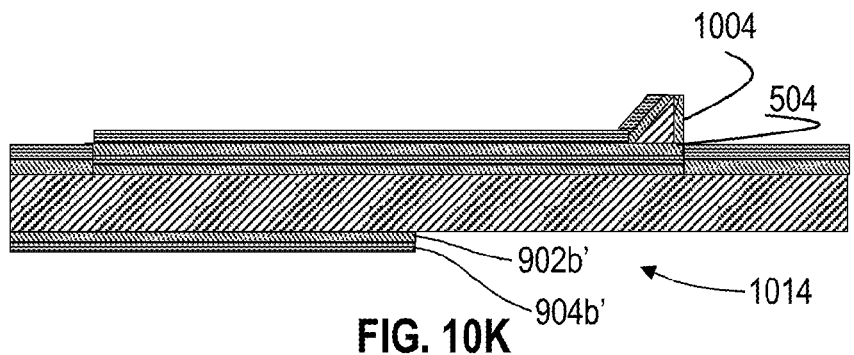
Figure 10L:
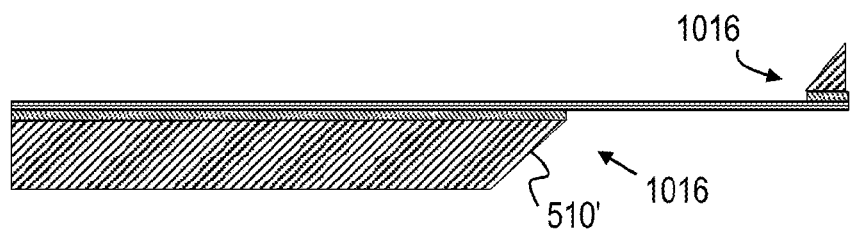
Figure 10M:
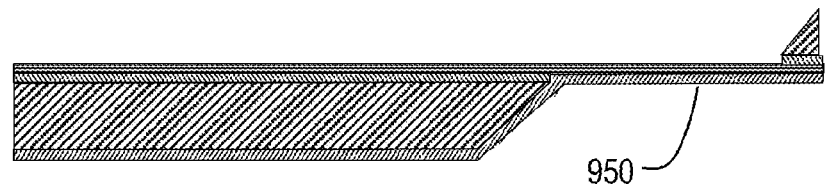
Figure 10N:
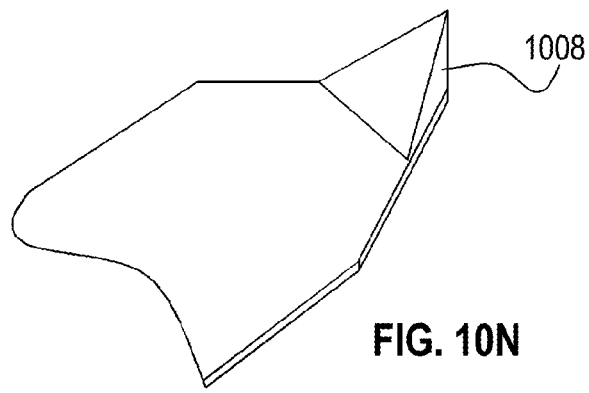
Figure 10O:
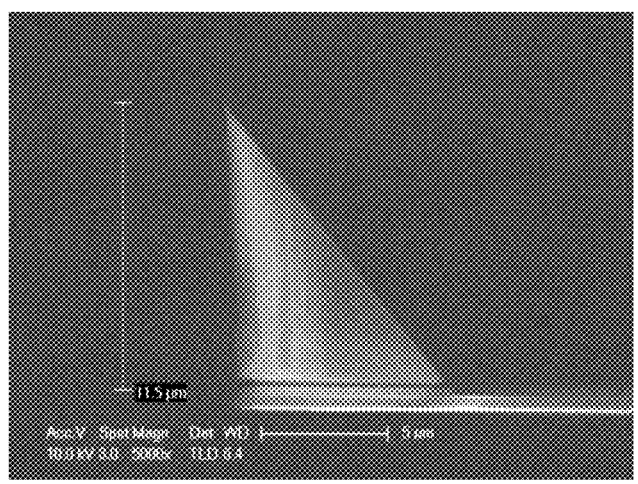

Turning now to FIGS. 10A-10O, a batch process is described according to a related embodiment for forming a SOI cantilever probe with a self-aligned probe tip that is aligned at the distal end of the cantilever arm, also referred to herein as a visible probe tip. Referring to FIG. 10A, the process begins with the multilayer structure 500. Oxide is grown using a thermal process to create oxide layers 902a and 902b as before, except this process is followed by selective removal of the top oxide layer 902a while leaving bottom side oxide layer 902b. Next, nitride layers 904a and 904b are deposited using LPCVD.

FIGS. 10B-1 and 10B-2 respectively illustrate cross-sectional and top views of the next processing steps of photolithography in which photoresist layer 1002 is applied and patterned as shown. Various other cantilever arm profiles may be used instead, in which case the patterning shape will vary accordingly. For example, the paddle shape described above (or variations thereof) may be used in a related embodiment.

The photoresist 1002 acts as a mask for etching nitride layer 904a into patterned nitride layer 904a' using a reactive ion etch (RIE) process, as depicted in FIGS. 10C-1 and 10C-2 in cross-sectional and top views, respectively. FIGS. 10D-1 and 10D-2 illustrate the next step of etching through the first device layer 502 using a high aspect ratio dry etch such as DRIE. This creates a vertical surface 1020 along the periphery of the remaining material in layer 502.

FIG. 10E illustrates the next operation in which oxide layer 504 and nitride layer 506a are stripped using a RIE process. The RIE process has no automatic stop, so incidental to this operation, some or all of oxide layer 508 and some of handle layer 510 may be stripped by RIE. These incidentals are not important at this stage, however, because these portions of handle layer 510 and oxide layer 508 will eventually be removed in subsequent processing.

Next, as depicted in FIG. 10F, the photoresist 1002 is stripped and vertical oxide 1004 is thermally grown on the orthogonal surface 1020. Next, as depicted in cross-sectional and top views in FIG. 10G-1 and 10G-2, the nitride layers 904a' and 904b are removed using a selective etch process 1005, and the top side oxide is patterned to leave a small portion along the orthogonal surface 1020 at the very distal end of what will be the cantilever arm.

Thereafter, as illustrated in FIG. 10H, silicon layer 502 is selectively etched at 1006 to form probe tip 1008. Probe tip 1008 includes an orthogonal surface on which oxide layer 1004 is grown. This orthogonal surface also includes the apex of the probe tip. Next, thermal oxide 1010 is grown on the other surfaces of probe tip 1008, as illustrated in FIG. 10I. After that, LPCVD nitride layers 1012a and 1012b are deposited on the top and bottom, as illustrated in FIG. 10J. Next, bottom side nitride 904b and oxide 902b are patterned and etched using a photolithography process 1014 to produce cut-away layers 902b' and 904b', as illustrated in FIG. 10H. FIG. 10L represents several operations of etching handle 510', then stripping the nitride layers 1012a and 1012b', stripping oxide layer 902b', oxide layer 1010, oxide layer 504, and oxide layer 1004. Finally, as illustrated in FIG. 10M, a metal layer 950 is applied if needed. FIG. 10N is a perspective view diagram illustrating visible probe tip 1008 at the free end of the cantilever arm. FIG. 10O is a scanning electron microscope (SEM) image showing an actual visible tip formed using the above process having a height of 11.5 microns.

Figure 11A:
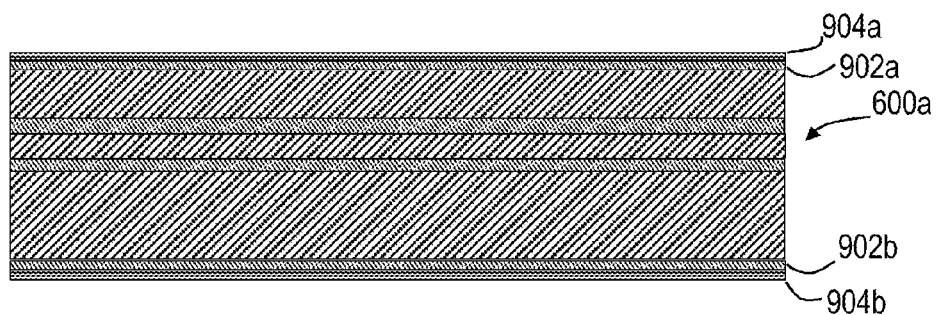
FIGS. 11A-11L illustrate an exemplary batch process for fabricating a cantilever probe having a very thin silicon cantilever arm and silicon probe starting with the multilayer structure of FIG. 6A according to one embodiment.
Figure 11B:
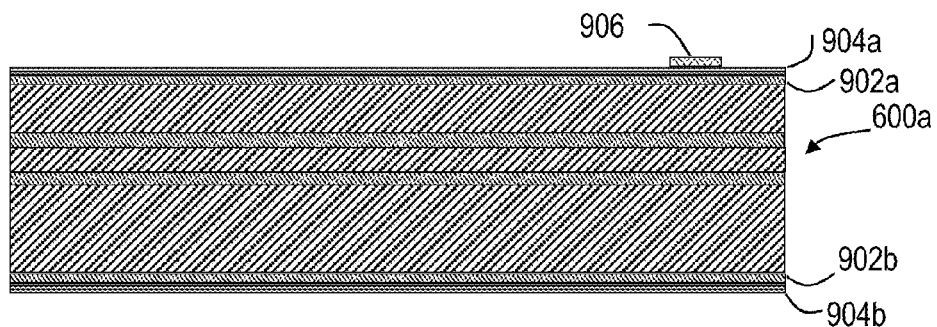
Figure 11C:
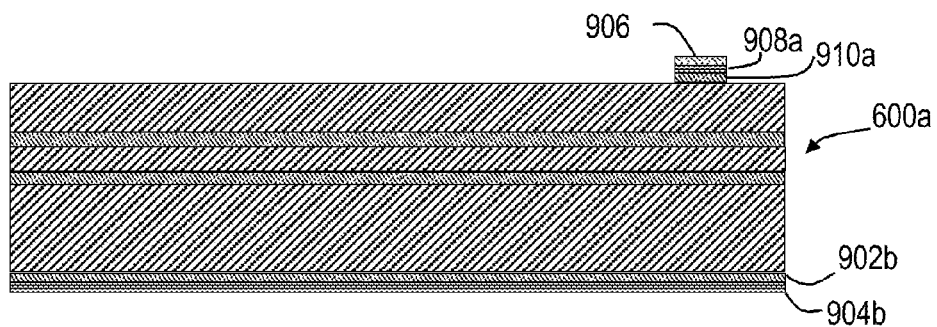
Figure 11D:
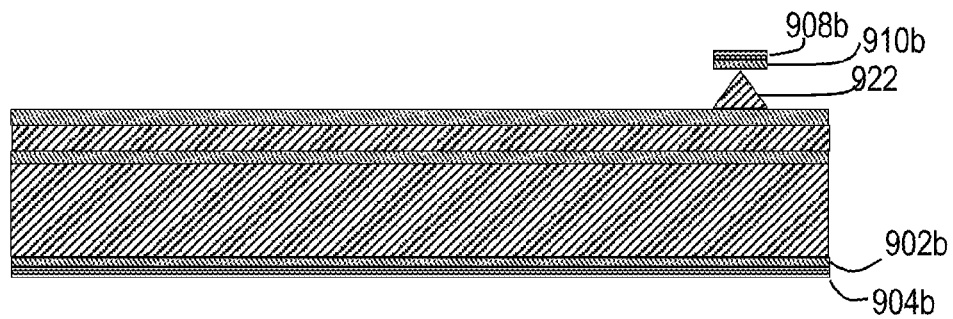
Figure 11E:
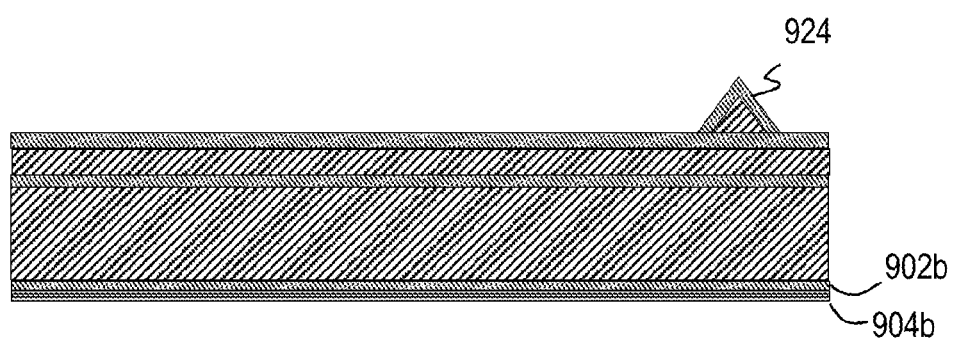

Turning now to FIGS. 11A-11L, an exemplary batch process illustrating operations for fabricating a cantilever probe having a very thin silicon cantilever arm and silicon probe tip is described according to one embodiment. The process starts with multilayer structure 600a. Similar to the steps described above for a SOI probe, oxide layers 902a and 902b are thermally grown, then nitride layers 904a and 904b are deposited, as depicted in FIG. 11A. FIGS. 11B-11C illustrate the operations for patterning an etch mask for forming the silicon probe tip using photoresist 906, and forming tip forming masks 908a and 910a. FIG. 11D illustrates the next operation of etching the first device layer to form tip 922. Next, as illustrated in FIG. 11E, the tip is thermally oxidized and thereby sharpened further.

Figure 11F:
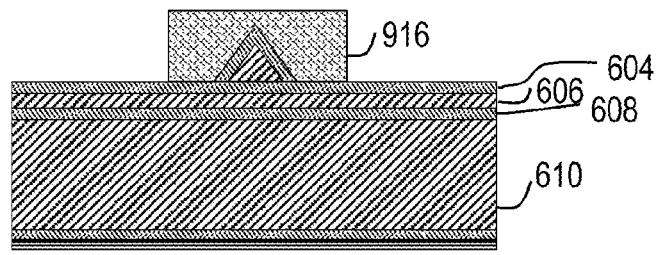
Figure 11G:
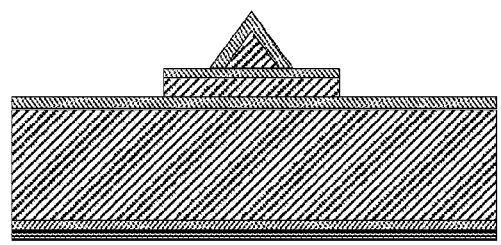

FIGS. 11F and 11G illustrate the patterning operations of the cantilever arm using photoresist 916. To mask a portion of layers 604 and 606, as well as the tip, for selective removal of extraneous material from layers 604 and 606. These operations are similar to those performed for the SOI cantilever fabrication, except that the interior layer 606 in this process is silicon; accordingly, a suitable selective etchant for silicon is used to etch the cantilever arm. The cantilever may be patterned to have the paddle-shaped profile as illustrated in the examples above according to certain embodiments.

Figure 11H:
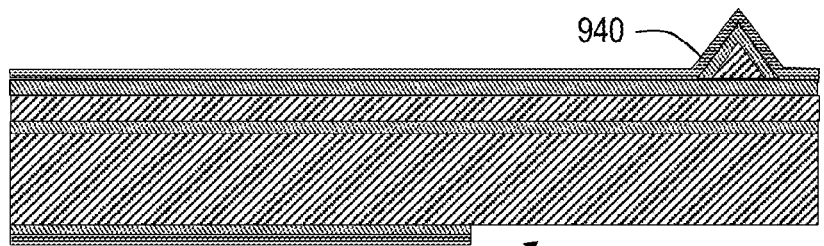
Figure 11I:
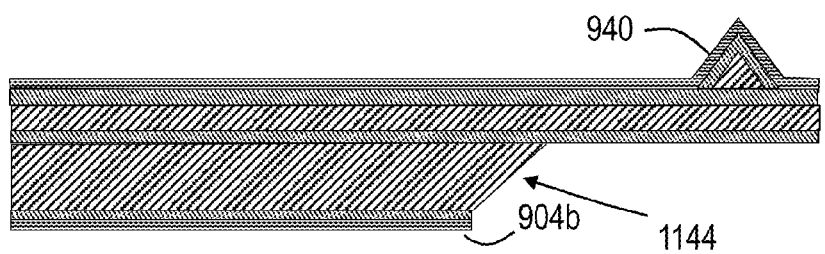
Figure 11J:
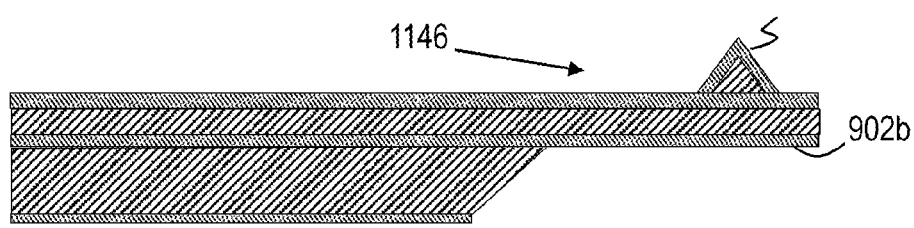
Figure 11K:
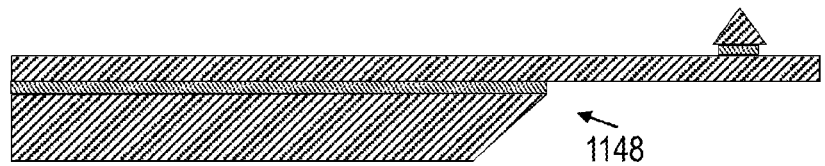
Figure 11L:
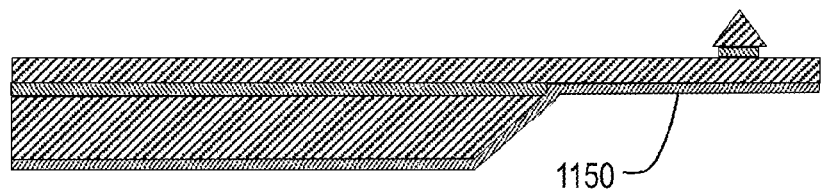

Next, as depicted in FIG. 11H, a protective layer 940 of nitride is deposited over the top side, and photolithography 1142 is performed on the back-side to strip away portions of the nitride and oxide layers 904b and 902b, respectively. Next, as illustrated in FIG. 11I, the handle layer is stripped using the remaining portions of layers 902b and 904b as an etch mask, and the cantilever arm is released. Next, as depicted in FIGS. 11J and 11K, the nitride layers 940 and 904b are stripped using selective etch process 1146, and the oxide layers 902b and 924 are stripped using selective etch 1148. Next, as shown in FIG. 11L, metal layer 1150 can be deposited if needed.

Figure 12A:
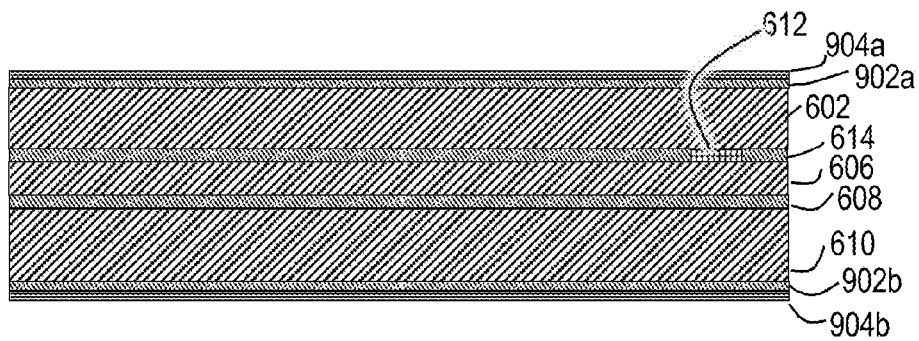
FIGS. 12A-12L illustrate an exemplary batch process for forming a conductive cantilever probe starting with the multilayer structure of FIG. 6B according to one embodiment.
Figure 12B:
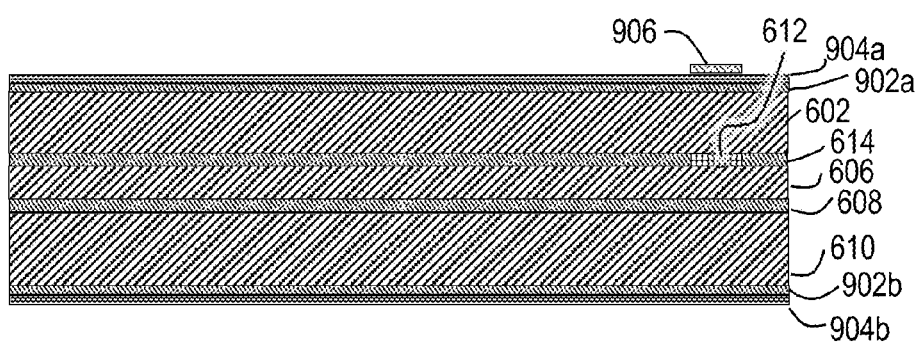
Figure 12C:
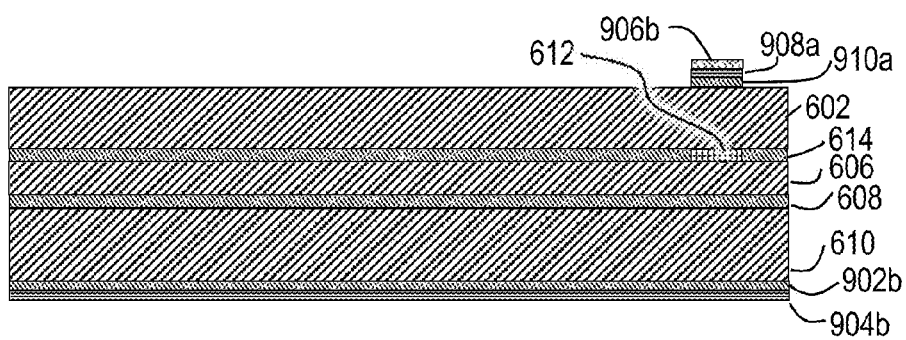
Figure 12D:
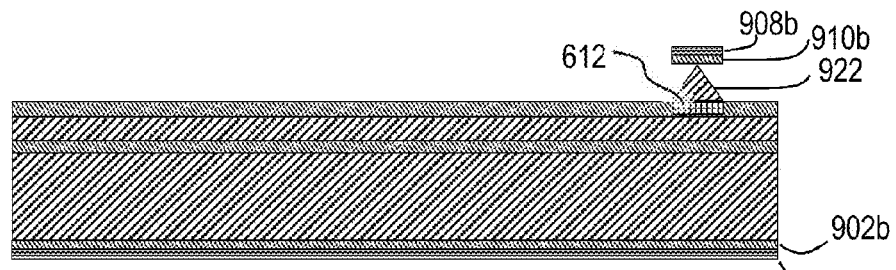
Figure 12E:
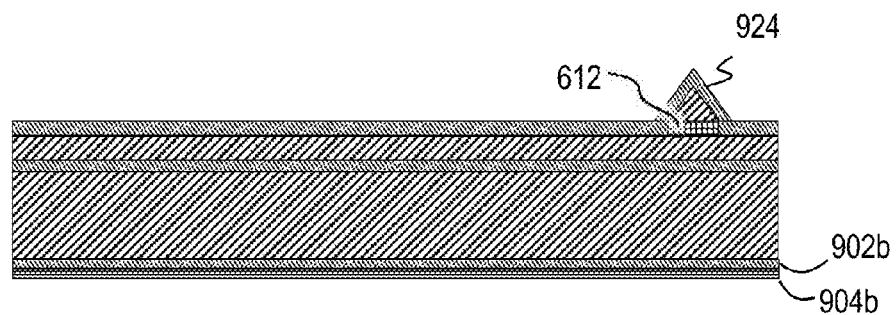
Figure 12F:
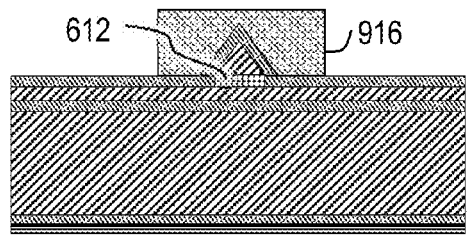
Figure 12G:
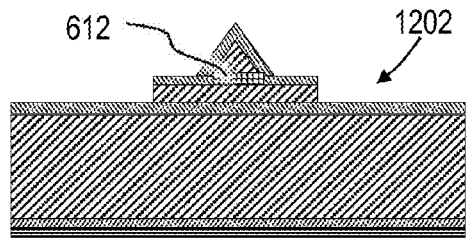
Figure 12H:
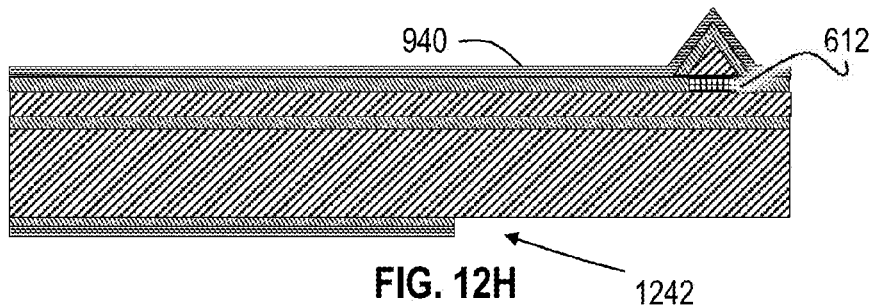
Figure 12I:
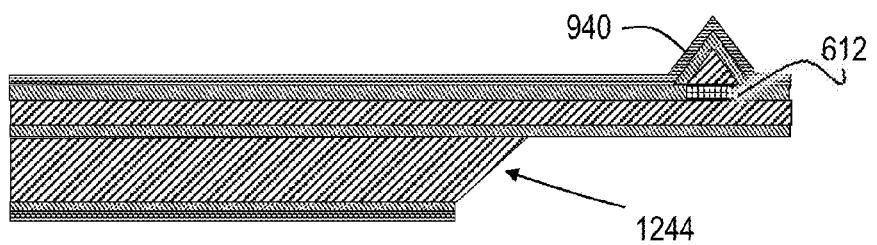
Figure 12J:
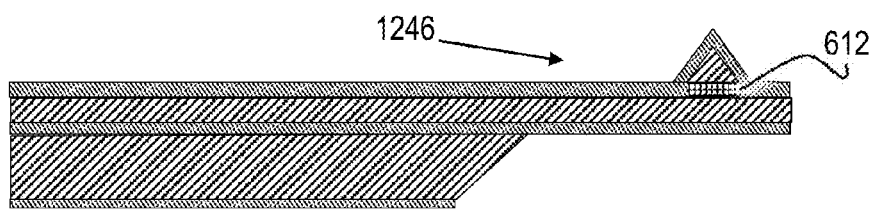
Figure 12K:
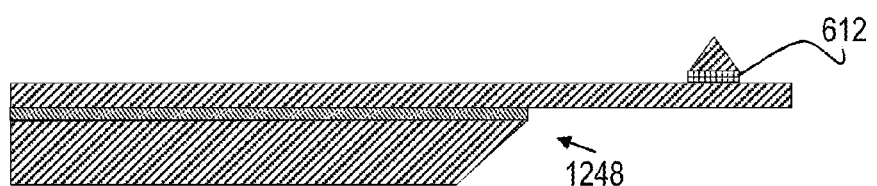
Figure 12L:
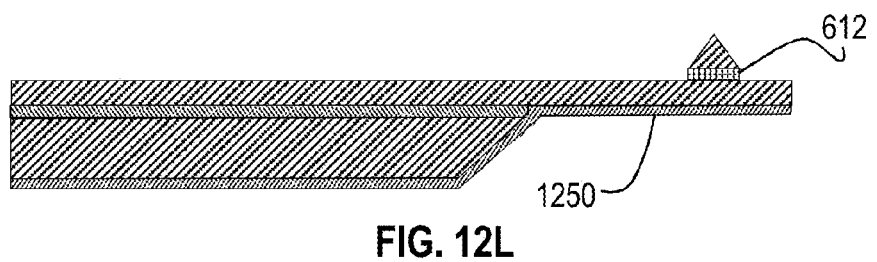

FIGS. 12A-12L illustrate an exemplary batch process for forming a conductive cantilever probe starting with the multilayer structure 600b according to one embodiment. As depicted in FIG. 12A, oxide layers 902a and 902b are thermally grown, and nitride layers 904a and 904b are deposited. As illustrated in FIG. 12B, photoresist 906 is deposited over conductive pad 912. These will not be in perfect alignment, but so long as there is sufficient overlap, the probe tip to be formed will be electrically connected to the cantilever arm. FIGS. 12B-12L illustrate the remaining operations of the process, which are similar to those for forming the non-conductive cantilever probes of FIGS. 11B-11L. Accordingly, FIGS. 12B-12D illustrate masking and etching of the probe tip; FIG. 12E illustrates growth of oxide 924 to sharpen the probe tip 922, FIGS. 12F and 12G illustrate patterning of the cantilever arm using photoresist mask 916 and selective etch operations 1202; FIGS. 12H-12I illustrate deposition of protective nitride layer 940 and back-side lithography 1242 to prepare the etch mask for etching the back-side nitride and oxide layers, and etch operation 1244 to form the handle and release the cantilever arm. In operation 1246 as depicted in FIG. 12J, the top and bottom nitride layers are stripped using a selective etch. In operation 1248 shown in FIG. 12K, the remaining top and back side oxide layers are stripped. Finally, in FIG. 12L, metal film 1250 is deposited on the back side if needed.

Notably, the processes detailed above produce a plurality of cantilever probes simultaneously, enabling mass production of such probes at low unit cost. At the same time, the processes can produce a dramatically-improved cantilever probe having very small dimensions at tight tolerance, meaning that the cantilever probe is usable with very high-speed SPM equipment by virtue of having a high mechanical resonance point, while maintaining a high degree of flexibility (i.e., low spring constant), thereby maintaining high sensitivity to interactions with samples being examined.

Certain embodiments of cantilever probes produced by these batch processes have additional features to support uniformity within fabricated batches, including the use of shoulder portions formed from the cantilever arm device layer, which obviate any length variation due to variation in thickness of the handle layer. Moreover, certain related embodiments include a cantilever arm profile that permits the formation of a very narrow neck portion for added sensitivity while providing a paddle face that can be more easily targeted by a laser system for tracking the movement and deflection of the free end of the cantilever probe.

Additionally, cantilever probes according to certain embodiments can include a visible tip having its apex situated in alignment with the distal end of the cantilever arm.

The embodiments detailed above are intended to be illustrative and not limiting. Additional embodiments are within the claims. In addition, although aspects of the present invention have been described with reference to particular embodiments, those skilled in the art will recognize that changes can be made in form and detail without departing from the scope of the invention, as defined by the claims.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features;

rather, the invention may comprise a combination of different individual features selected from different individual embodiments, as will be understood by persons of ordinary skill in the art.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present Application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method for constructing a cantilever for use with a scanning probe microscope (SPM), the method comprising:
    (a) obtaining a multilayer structure comprising an upper substrate, a lower substrate, an interior layer, a first separation layer, and a second separation layer, wherein the first separation layer is situated between the upper substrate and the interior layer, the second separation layer is situated between the lower substrate and the interior layer, and wherein the first and the second separation layers are differentially etchable with respect to the upper and the lower substrates, respectively and with respect to the interior layer;
    (b) selectively removing material from the upper substrate to form a probe tip structure having a sharp point facing away from the first separation layer and to expose a top surface of the first separation layer;
    (c) after (b), selectively removing material from the first separation layer to expose a top surface of the interior layer;
    (d) selectively removing material from the lower substrate to expose a bottom surface of the second separation layer;
    (e) after (d), selectively removing material from the second separation layer to expose a bottom surface of the interior layer;
    (f) selectively removing material from the interior layer to pattern a cantilever arm therefrom.

2. The method of claim 1, wherein (f) is performed after (c) but before (d).

3. The method of claim 1, wherein (f) is performed after (e) but before (b).

4. The method of claim 1, wherein selectively removing material involves applying a differential etchant that removes corresponding material that is the subject of that selective etch while leaving other layers substantially unaffected.

5. The method of claim 1, wherein in obtaining a multilayer structure in (a), the upper substrate and the lower substrate are each formed from silicon, and wherein in (b) and (d), selectively removing the material includes etching only the silicon.

6. The method of claim 1, wherein in obtaining a multilayer structure in (a), the first separation layer and the second separation layer are each formed from an oxide, and wherein in (c) and (d), selectively removing the material includes etching only the oxide.

7. The method of claim 1, wherein in obtaining a multilayer structure in (a), the interior layer is formed from a nitride, and wherein in (f) selectively removing the material includes etching only the nitride.

8. The method of claim 1, wherein in obtaining a multilayer structure in (a), the interior layer is formed from silicon, and wherein in (f) selectively removing the material includes etching only the silicon.

9. The method of claim 1, wherein in obtaining a multilayer structure in (a), the first separation layer includes a portion formed from a conductive material, and wherein forming the probe tip structure in (b) includes preventing etching of the upper substrate material situated over the conductive material.

10. A cantilever probe for use with a scanning probe microscope (SPM), the cantilever probe formed according to a method comprising:
    (a) obtaining a multilayer structure comprising an upper substrate, a lower substrate, an interior layer, a first separation layer, and a second separation layer, wherein the first separation layer is situated between the upper substrate and the interior layer, the second separation layer is situated between the lower substrate and the interior layer, and wherein the first and the second separation layers are differentially etchable with respect to the upper and the lower substrates, respectively and with respect to the interior layer;
    (b) selectively removing material from the upper substrate to form a probe tip structure having a sharp point facing away from the first separation layer and to expose a top surface of the first separation layer;
    (c) after (b), selectively removing material from the first separation layer to expose a top surface of the interior layer;
    (d) selectively removing material from the lower substrate to expose a bottom surface of the second separation layer;
    (e) after (d), selectively removing material from the second separation layer to expose a bottom surface of the interior layer;
    (f) selectively removing material from the interior layer to pattern a cantilever arm therefrom.

11. The cantilever probe of claim 10, wherein in the method of forming the cantilever probe (f) is performed after (c) but before (d).

12. The cantilever probe of claim 10, wherein in the method of forming the cantilever probe (f) is performed after (e) but before (b).

13. The cantilever probe of claim 10, wherein in the method of forming the cantilever probe, selectively removing material involves applying a differential etchant that removes corresponding material that is the subject of that selective etch while leaving other layers substantially unaffected.

14. The cantilever probe of claim 10, wherein in obtaining a multilayer structure in (a) according to the method of forming the cantilever probe, the upper substrate and the lower substrate are each formed from silicon, and wherein in (b) and (d), selectively removing the material includes etching only the silicon.

15. The cantilever probe of claim 10, wherein in obtaining a multilayer structure in (a) according to the method of forming the cantilever probe, the first separation layer and the second separation layer are each formed from an oxide, and wherein in (c) and (d), selectively removing the material includes etching only the oxide.

16. The cantilever probe of claim 10, wherein in obtaining a multilayer structure in (a) according to the method of forming the cantilever probe, the interior layer is formed from a nitride, and wherein in (f) selectively removing the material includes etching only the nitride.

17. The cantilever probe of claim 10, wherein in obtaining a multilayer structure in (a) according to the method of forming the cantilever probe, the interior layer is formed from silicon, and wherein in (f) selectively removing the material includes etching only the silicon.

18. The cantilever probe of claim 10, wherein in obtaining a multilayer structure in (a) according to the method of forming the cantilever probe, the first separation layer includes a portion formed from a conductive material, and wherein forming the probe tip structure in (b) includes preventing etching of the upper substrate material situated over the conductive material.

* * * * *